(12) United States Patent
Hashimoto

(10) Patent No.: US 6,414,382 B1
(45) Date of Patent: Jul. 2, 2002

(54) FILM CARRIER TAPE, SEMICONDUCTOR ASSEMBLY, SEMICONDUCTOR DEVICE AND METHOD OF MANUFACTURING THE SAME, MOUNTED BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 19 days.

(21) Appl. No.: 09/696,916

(22) Filed: Oct. 27, 2000

Related U.S. Application Data

(63) Continuation of application No. 09/155,062, filed as application No. PCT/JP98/00131 on Feb. 18, 1999, now Pat. No. 6,175,151.

(30) Foreign Application Priority Data

Jan. 23, 1997 (JP) ............................... 9-10722
Mar. 21, 1997 (JP) ............................... 9-87443

(51) Int. Cl.⁷ .................... H01L 23/495; H01L 23/48
(52) U.S. Cl. .................. 257/676; 257/673; 257/783; 257/774
(58) Field of Search ................. 257/676, 673, 257/693, 783, 774; 438/123; 361/813

(56) References Cited

U.S. PATENT DOCUMENTS

| | | | |
|---|---|---|---|
| 4,811,081 A | 3/1989 | Lyden | 257/783 |
| 5,127,570 A | 7/1992 | Steitz et al. | 228/180.2 |
| 5,518,957 A * | 5/1996 | Kim | 438/123 |
| 5,602,419 A | 2/1997 | Takeda et al. | 257/673 |
| 5,834,338 A * | 11/1998 | Taketa et al. | 438/123 |
| 5,849,608 A * | 12/1998 | Abe | 438/123 |
| 5,905,303 A | 5/1999 | Kata et al. | 257/701 |

FOREIGN PATENT DOCUMENTS

| | | |
|---|---|---|
| EP | 0 482 940 | 10/1991 |
| EP | 0 684 644 | 5/1995 |
| EP | 0684644 A1 | 11/1995 |
| JP | A-51-46874 | 4/1976 |
| JP | A-61-100940 | 5/1986 |
| JP | A-61-172361 | 8/1986 |
| JP | A-63-102329 | 5/1988 |
| JP | A-63-110506 | 5/1988 |
| JP | A-63-97235 | 6/1988 |
| JP | 1-270241 A | 10/1989 |
| JP | A-2-166745 | 6/1990 |
| JP | A-4-233749 | 8/1992 |
| JP | A-5-13500 | 1/1993 |
| JP | A-6-69277 | 3/1994 |
| JP | 06-069277 | 3/1994 |
| JP | A-6-120296 | 4/1994 |
| JP | A-6-151505 | 5/1994 |
| JP | A-6-333997 | 12/1994 |
| JP | 06 302647 A | 2/1995 |
| JP | A-7-183333 | 7/1995 |
| JP | A-7-183628 | 7/1995 |
| JP | A-7-226418 | 8/1995 |
| JP | A-7-297236 | 11/1995 |
| JP | A-7-297320 | 11/1995 |
| JP | A-7-321157 | 12/1995 |
| JP | A-7-326644 | 12/1995 |
| JP | A-8-78473 | 3/1996 |
| JP | A-8-78484 | 3/1996 |
| JP | A-8-83818 | 3/1996 |
| JP | A-8-88243 | 4/1996 |
| JP | A-8-88293 | 4/1996 |
| JP | A-8-172114 | 7/1996 |
| JP | A-8-274214 | 10/1996 |
| JP | A-8-306745 | 11/1996 |
| JP | A-8-335593 | 12/1996 |
| JP | A-8-335606 | 12/1996 |

* cited by examiner

*Primary Examiner*—Jasmine J. B. Clark
(74) *Attorney, Agent, or Firm*—Oliff & Berridge, PLC

(57) ABSTRACT

A semiconductor device which does not require solder resist to be applied to the surface. Leads 54 are formed on one surface of a polyimide film 10, external connection terminals 11 are formed on the leads 54 to project from the other surface of the polyimide film 10 through via holes 30, and an IC chip 15 is adhered to the first surface, so that the leads 54 are covered by the IC chip 15, and the application of a solder resist can be omitted.

2 Claims, 29 Drawing Sheets

F I G. 30
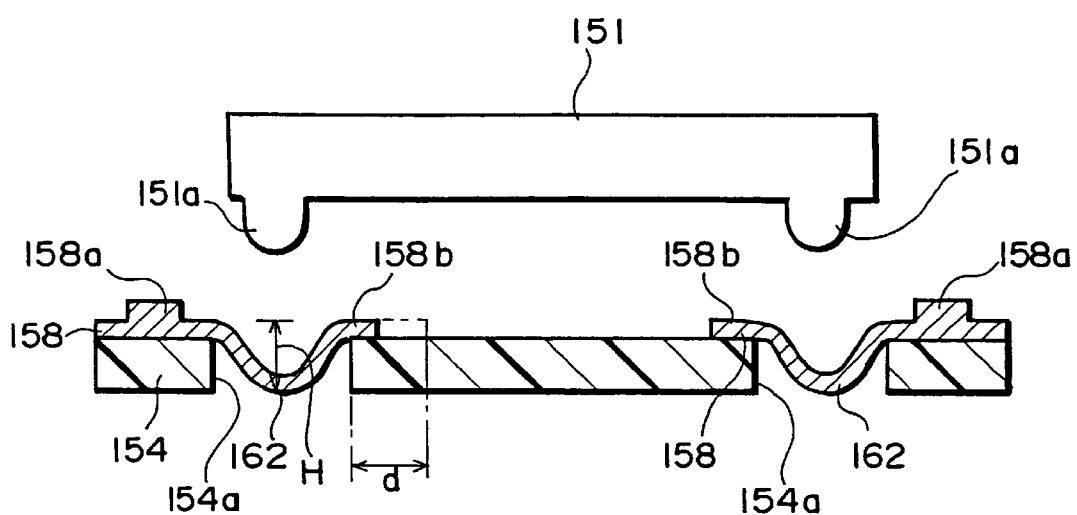

FILM CARRIER TAPE, SEMICONDUCTOR ASSEMBLY, SEMICONDUCTOR DEVICE AND METHOD OF MANUFACTURING THE SAME, MOUNTED BOARD, AND ELECTRONIC INSTRUMENT

This is a Continuation of application Ser. No. 09/155,062 filed Feb. 18, 1999 (U.S. National Stage of PCT/JP98/00131 filed Jan. 16, 1998) now U.S. Pat. No. 6,175,151. The entire disclosure of the prior application is hereby incorporated by reference herein in its entirety.

TECHNICAL FIELD

The present invention relates to a film carrier tape, semiconductor assembly, semiconductor device, and method of manufacturing the same, mounted board, and electronic instrument, and particularly to chip size package (CSP) fabrication technology and mounting technology for CSP.

BACKGROUND ART

There is no formal definition of chip size/scale package (CSP), but generally this refers to an IC package in which the package size is the same as or only very slightly larger than the chip size. The development of CSP technology is very important for improving packaging density.

CSP differs from a quad flat package (QFP) having outer leads only around the periphery of the package, in having external connection terminals arranged in a plane, and capable of being surface mounted. More specifically, a conventional CSP comprises a polyimide substrate on which wiring is formed, external connection terminals formed on this wiring, and a semiconductor chip attached on the surface of the polyimide substrate opposite to that on which the external connection terminals are formed, and the wiring is connected to the electrodes of the semiconductor chip. Moreover, solder resist is applied to the surface of the wiring, and oxidation of the wiring is prevented.

When solder resist adheres not only to the wiring but also to the external connection terminals, during mounting bad electrical connections occur. Because of this, solder resist adhering to the external connection terminals must be removed, or the solder resist must be applied to avoid the external connection terminals, complicating the process.

The present invention seeks to solve the above mentioned problems, and has as its object the provision of a film carrier tape, semiconductor assembly, semiconductor device, and method of manufacturing the same, mounted board, and electronic instrument to which CSP technology is applied, but in which the application of solder resist to the surface is avoided.

DISCLOSURE OF THE INVENTION

The film carrier tape of the present invention comprises:
a substrate material having flexible and insulating properties; and
a wiring pattern formed on one of sides of the substrate material, the wiring pattern including a plurality of leads connected to a semiconductor element and a pad integrally formed with each of the leads for an external connection terminal formed thereon, each of the leads being adhered to the substrate material on a whole surface facing the substrate material, and the substrate material having an opening at a position corresponding to the pad for forming the external connection terminal.

According to the present invention, since an opening is provided beforehand, external connection terminals can be provided on the surface opposite to that on which the wiring pattern is formed, connected to the wiring pattern through the opening. Therefore, it is not necessary to apply solder resist to the wiring pattern while avoiding external connection terminals. Moreover, if a semiconductor element is disposed on the surface on which the wiring pattern is formed, the wiring pattern is not exposed, and therefore the application of a solder resist can be omitted.

In this way, a semiconductor element is disposed on the surface of the substrate material on which the wiring pattern is formed, and a structure for connection to the mounted board is provided on the opposite surface, and thereby an ultracompact semiconductor device can be obtained.

The opening is formed to correspond to the pads, and therefore the pads are independent of the substrate material. Therefore, the incidence of stress between the pads and the substrate material can be reduced.

In the present invention, the connection portion with the semiconductor element by the leads, being the most important, is adhered to the substrate material. Therefore, from the time when the film carrier tape is fabricated until the subsequent processes (semiconductor assembly fabrication, semiconductor device fabrication), that is to say, after the time of pattern formation, if a lead is subjected to an external load, it is supported by the substrate material and bending of the leads can be prevented. There is therefore the advantage that the positioning of the leads and the bonding pads of the semiconductor element can be carried out accurately. In particular, in an embodiment in which very fine processing technology is required, such as CSP, the larger the free region of the leads the more likely bending is to occur, but if as in the present invention the connection portion of the leads is adhered to the substrate material, handling is made easier.

Furthermore, in the present invention, the wiring pattern including the leads is formed on the surface of the substrate material, and part of the leads forms a connection portion with the semiconductor element. Therefore, the region other than the connection portion of the leads is also formed on the surface of the substrate material, so that compared with the structure in which the connection portion only is a separate member, it is possible to apply thermal stress and the like evenly, and an improvement in the reliability of the connection portion can be achieved.

In the present invention, since a semiconductor element is connected to part of the wiring pattern formed on the substrate material, the ingress of moisture can be prevented, compared to the case in which the semiconductor element is connected to the wiring pattern by a separate member and filled with resin. In particular, for a CSP, since the package is close to the electrodes, the present invention is efficacious.

The film carrier tape may further comprise projections formed on the wiring pattern on the substrate material, of the same material as the wiring pattern and used for connection to the semiconductor element.

Through the projections formed on the wiring pattern on the substrate material, an electrical connection between the electrodes formed on the semiconductor element and the wiring pattern can be obtained, and as far as possible a conventional TAB (Tape Automated Bonding) production line and existing technology can be used, enabling the burden of equipment and the burden of the development of special technology to be lightened.

Since the projections and wiring pattern are formed of the same material, the coefficient of thermal expansion is the same, and when a thermal stress is applied to them, no thermal stress occurs between them, and therefore the film carrier tape and a semiconductor assembly or semiconductor device formed using the same can have its thermal reliability improved. Since the oxidation-reduction potential is the same, even if humidity stress is applied, no local cells form, and therefore the reliability with respect to humidity can also be improved.

The film carrier tape of the present invention comprises:

a substrate material;

a wiring pattern formed on one of sides of the substrate material; and a stress relieving portion provided on the one of sides of the substrate material, in a region corresponding to a position for forming at least an external connection terminal and avoiding a connection portion of the wiring pattern for connection to a semiconductor element.

In this film carrier tape, a conductive resin may be provided at least on the connection portion. By means of this conductive resin, the electrical connection with the semiconductor element is achieved.

In particular, it is preferably a film carrier tape such that the connection portion is of convex form.

The semiconductor assembly of the present invention comprises:

a substrate material having flexible and insulating properties;

a wiring pattern formed in adherence with one of sides of the substrate material;

a plurality of semiconductor elements disposed on a surface of the substrate material on which the wiring pattern is formed;

a connection portion forming part of the wiring pattern, electrically connected to each of the semiconductor elements, and adhered to the substrate material;

a plurality of pads forming part of the wiring pattern, each of the pads being provided for forming an external connection terminal thereon; and a portion of the substrate material defining an opening corresponding to each of the pads.

By means of this structure, there is the benefit that a semiconductor assembly can be obtained such that as far as possible a conventional TAB (Tape Automated Bonding) production line and existing technology can be used, enabling the burden of equipment and the burden of the development of special technology to be lightened.

Furthermore, the connection portion to the semiconductor element which is most important is not within a hole, but can be formed on the substrate material, for which reason there is the benefit that a semiconductor assembly can be obtained such that during semiconductor assembly fabrication, even if an external load is applied to the wiring pattern, bending thereof can be prevented. Therefore, there is the benefit that a semiconductor assembly can be obtained such that positioning of the wiring pattern and semiconductor element is carried out accurately.

On at least either of electrodes of the semiconductor element and the wiring pattern, projections may be formed opposing the other thereof.

These projections may be formed on the wiring pattern.

By means of this structure, bumps are not required on the semiconductor element, and therefore a semiconductor element having general-purpose aluminum electrodes can be used. As a result of this, any semiconductor element from any manufacturer can be adopted, and the number of different semiconductor elements to which application is possible is increased.

These projections may be formed on the electrodes of the semiconductor element.

By means of this structure, in the case where a semiconductor element having bumps (projections) of solder or gold on the electrodes can be selected, the formation of projections on the film carrier tape used is not required. Therefore, since a normal TAB film carrier tape (film carrier tape with finger leads only, without projections formed) used conventionally can be used, there is the benefit that the number of different types of film carrier tape which can be used is increased.

The semiconductor assembly may further comprise an insulating resin between the semiconductor elements and the substrate material facing the semiconductor elements.

By means of this structure, the surface of active elements of the semiconductor element is covered by the insulating resin, and therefore moisture does not accumulate on the surface of active elements, so that there is the benefit that the reliability of the semiconductor device with respect to humidity is improved.

Furthermore, by means of the insulating resin between the semiconductor element and substrate material, when the wiring pattern is formed on the substrate material, since this location is also covered by the insulating resin, moisture does not accumulate, so that there is the benefit that the reliability of the semiconductor device with respect to humidity is improved.

Projections may be formed on at least either of electrodes of the semiconductor elements and the wiring pattern in such a manner as to face the other thereof; and the insulating resin may include conductive particles at least between the electrodes of the semiconductor elements and the connection portion.

By means of this structure, the interval between the semiconductor element electrodes and the wiring pattern, which is required to be electrically conducting, includes conductive particles. As a result of this, even if there are surface irregularities, the conductive particles absorb these irregularities to provide a stable electrical conduction, and therefore there is the benefit that the electrical conductivity reliability between the electrodes and the wiring pattern is improved.

The insulating resin may be an anisotropic conducting film or an anisotropic conducting adhesive.

By means of this structure, between the semiconductor element electrodes and the wiring pattern, to which electrically conductivity is required to be imparted, conductive particles dispersed in an anisotropic conductive film or anisotropic conductive adhesive are pressed. Thus stable conduction is effected in this portion only, and in other portions as for the anisotropic conductive film or anisotropic conductive adhesive, the conductive particles are not pressed. Therefore, the anisotropic conductive film or anisotropic conductive adhesive functions as a stable insulating adhesive, and the effect is the same as of the surface of active elements of the semiconductor element being covered by an insulating resin. Moisture does not accumulate on the surface of active elements, so that the reliability of the semiconductor device with respect to humidity is improved.

Furthermore, by means of the anisotropic conductive film or anisotropic conductive adhesive equivalent to an insulating resin between the semiconductor element and the substrate material, moisture does not accumulate on the wiring pattern, so that there is the benefit that reliability of the semiconductor device with respect to humidity is improved.

By means of this structure, the fact that the above effects can be obtained simultaneously and simply, is a benefit of great excellence.

The semiconductor device of the present invention comprises:
- a substrate material having flexible and insulating properties;
- a wiring pattern formed in adherence with one of sides of the substrate material;
- a semiconductor element disposed on a surface of the substrate material on which the wiring pattern is formed;
- a connection portion forming part of the wiring pattern, electrically connected to the semiconductor element, and adhered to the substrate material;
- a plurality of pads forming part of the wiring pattern;
- a portion of the substrate material defining an opening corresponding to each of the pads; and
- an external connection terminal projecting on a surface of the substrate material opposite to the surface on which the semiconductor element is disposed, the external connection terminal being connected to each of the pads through the opening.

By means of this structure, using the above described semiconductor assembly, an opening is formed in the substrate material underneath the wiring pattern, and through the opening, the external connection terminals are connected to the wiring pattern. The external connection terminals project from the surface of the substrate material opposite to that on which the semiconductor element is disposed. In this way, a semiconductor device having an area approximately equal to that of the active surface of the semiconductor element can be obtained immediately beneath the active surface of the semiconductor element.

On at least one of the wiring pattern and the electrodes, projections may be formed in such a manner as to face the other thereof.

By means of this structure, electrical connection of the wiring pattern and electrodes is achieved by the projections.

If the external connection terminals are formed of solder, mounting in a single operation on a main board, referred to as a motherboard, is possible together with SMDs (surface mounted devices) other than that of the present invention by SMT (surface mounting technology), and there is the excellent benefit that with respect to the mounting of the semiconductor device, no special mounting equipment is required to be invested in.

The semiconductor device of the present invention comprises:
- a substrate material having a wiring pattern formed on one of surfaces of the substrate material, and external connection terminals formed on another surface of the substrate material; and
- a semiconductor element having electrodes on one of surfaces of the semiconductor element, the one of surfaces of the substrate material and the one of surfaces of the semiconductor element facing each other with a certain spacing therebetween, the wiring pattern and the electrodes being connected through a conductive resin, and a stress relieving portion being provided between the substrate material and the semiconductor element in a region avoiding the electrodes.

Since the wiring pattern and electrodes are connected by a conductive resin, special jigs and mechanical equipment are not required. Between the substrate material and the semiconductor element, a stress relieving portion is provided, and therefore stress applied to the external connection terminals can be relieved. That is to say, when this semiconductor device is for example mounted on a circuit board, if the temperature changes, a stress occurs because of the difference between the coefficient of thermal expansion of the circuit board and the coefficient of thermal expansion of the substrate material, tending to tilt the external connection terminals, but this stress can be absorbed by the stress relieving portion. In this way, the crack resistance of the external connection terminals can be improved.

The stress relieving portion may be provided only in a region corresponding to the external connection terminals and the vicinity thereof.

The stress relieving portion serves to relieve stress applied to the external connection terminals, and therefore even if only provided in a region corresponding to the external connection terminals and the vicinity thereof, is able to function.

The semiconductor device of the present invention comprises:
- a substrate material having a wiring pattern formed on one of surfaces of the substrate material, and external connection terminals formed on another surface of the substrate material, the substrate material also having a hole in a region for forming each of the external connection terminals, the wiring pattern having a three-dimensionally bent portion entering the hole, and each of the external connection terminals being formed on the three-dimensionally bent portion;
- a semiconductor element facing the one of surfaces of the substrate material and having electrodes which are connected to the wiring pattern; and
- an adhesion layer between the substrate material and the semiconductor element.

Three-dimensionally bent portions are constructed so as to be able to be deformed into the holes, and by this structure stress applied to the external connection terminals can be absorbed.

The semiconductor device of the present invention comprises:
- a substrate material having a wiring pattern formed on one of surfaces of the substrate material, and external connection terminals formed on another surface of the substrate material, the wiring pattern having a plane bent portion bent along the surfaces of the substrate material;
- a semiconductor element facing the one of surfaces of the substrate material and having electrodes connected to the wiring pattern; and
- an adhesion layer between the substrate material and the semiconductor element.

By means of the plane bent portions, stress applied to the external connection terminals can be absorbed.

The substrate material may have a hole in a region corresponding to the plane bent portions. In this way, the plane bent portions are more easily deformed into the holes, and the stress absorption is improved.

The wiring pattern may have projections, and the projections and the electrodes may be connected through the conductive resin.

In this way, by the connection of the projections to the electrodes, with a certain spacing between the substrate material and the semiconductor element, a stress relieving portion can be formed.

The conductive resin may be an anisotropic conducting film, and may be applied in planar form between the substrate material and the semiconductor element; and conductive particles included in the anisotropic conducting film may be pressed between the projections and the electrodes to achieve conduction.

The anisotropic conductive film comprises a resin in sheet form with a conductive filler dispersed therein, and can be made conducting simply by being pressed.

The conductive resin may be provided only in a region corresponding to the projections and the electrodes and the vicinity thereof.

This conductive resin serves to provide conduction between the projections and the electrodes, and by being used only in the minimum required quantity allows the materials cost to be kept low.

The semiconductor device of the present invention comprises:

a substrate material having a wiring pattern formed on one of sides of the substrate material, and external connection terminals projecting from another side of the substrate material;

a stress relieving portion provided on the one of sides of the substrate material;

a semiconductor element provided in a position to sandwich with the substrate material the stress relieving portion; and a wire electrically connecting the wiring pattern and the semiconductor element.

Since the wiring pattern is provided on the opposite side to the external connection terminals, the wiring pattern is not exposed to the exterior. The relieving of stress is achieved by the stress relieving layer.

The substrate material may have a hole in a region for forming each of the external connection terminals, the wiring pattern may have a three-dimensionally bent portion entering the hole, and each of the external connection terminals may be formed on the three-dimensionally bent portion.

By means of this, stress relief by the three-dimensionally bent portions can be even more so achieved.

The method of making a film carrier tape of the present invention comprises:

a step of providing a metal forming a wiring pattern on a substrate material having flexible and insulating properties;

a step of forming the wiring pattern from the metal, including a plurality of leads; and a step of forming a separate opening in the substrate material in at least a portion of a region overlapping each of the leads.

According to this method, there is no difficult step of handling the tape with the unhardened adhesive attached, but the tape is handled after the hardening of the adhesive is completed and after the metal comprising the wiring pattern has been attached. Therefore, to a degree, rough handling can be used, and the process is not limited, so that there is the benefit that the process freedom of the process forming holes is increased.

In this way, the above described film carrier tape can be fabricated.

In the method of making a film carrier tape, the step of forming the wiring pattern may include a step of half etching the wiring pattern excluding at least a part of the leads.

If the portion of the wiring pattern excluding a part of the wiring pattern over the substrate material is subjected to half etching, the excluded part remains as projections. In this way, in a single operation, there is the benefit that projections can be easily formed on the wiring pattern.

The method of making a film carrier tape may further comprise a step of gold-plating the projections after the half etching step.

According to this method, at the time of bonding with the bonding pads (aluminum electrodes) formed on the semiconductor element, the gold plating formed on the projections can act as a gold supply material for the gold-aluminum alloy which is the bonding material without providing a bonding material. Therefore, there is the effect that the subsequent bonding process is greatly simplified.

The method of making a semiconductor assembly of the present invention comprises:

a step of preparing a film carrier tape, the film carrier tape comprising a substrate material and a wiring pattern formed on one of sides of the substrate material, the wiring pattern comprising a plurality of leads connected to a semiconductor element and a pad having an external connection terminal and formed integrally with each of the leads, a connection portion of each of the leads with the semiconductor element being adhered to the substrate material to be supported, and the substrate material having an opening for forming the external connection terminal at a position corresponding to the pad;

a step of positioning electrodes of the semiconductor element in a mounting region of the wiring pattern on a surface of the substrate material on which the wiring pattern is formed; and a step of electrically connecting the wiring pattern and the electrodes.

According to this method, there is the benefit that a method of obtaining a semiconductor assembly can be obtained such that as far as possible a conventional TAB (Tape Automated Bonding) production line and existing technology can be used, enabling the burden of equipment and the burden of the development of special technology to be lightened.

Furthermore, the connection portion with the semiconductor element by the leads, being the most important, is not within a hole, but can be formed on the substrate material, for which reason there is the benefit that a semiconductor assembly can be obtained such that during semiconductor assembly fabrication, even if an external load is applied to the leads, bending of the leads can be prevented. Therefore, there is the benefit that a method of obtaining a semiconductor assembly can be obtained such that positioning of the leads and the bonding pads of the semiconductor element is carried out accurately.

Projections may be formed on at least one of the wiring pattern and the electrodes in such a manner as to face the other thereof; and the step of electrical connection may be achieved by the application of ultrasound from the side of the wiring pattern of the side of the semiconductor element to the projections.

For example, if ultrasound is used for bonding the wiring pattern and electrodes, the damage to the semiconductor element and substrate material by heat and pressure can be very greatly reduced. In this way, a semiconductor assembly of high reliability can be fabricated.

Before the step of electrical connection, an insulating resin may be provided between the wiring pattern and the semiconductor element facing the wiring pattern; and after the step of electrical connection, the insulating resin may be hardened.

According to this method, since an insulating resin can be provided beforehand by a method such as painting or printing on the opposing surfaces of the film carrier tape and semiconductor element, an optimum insulating resin and an optimum application method can be selected. Then there is the effect that the effect according to the objective (for example, putting emphasis on reliability or putting emphasis on reducing cost) can be selected beforehand.

After the step of electrical connection, an insulating resin may be injected and hardened between the wiring pattern and the semiconductor element facing the wiring pattern.

According to this method, it is possible to adopt the same process as in conventional orthodox flip-chip mounting. Therefore, where the processing equipment for flip-chip mounting is already installed, no new investment in equipment is required.

The step of electrical connection may be achieved by the application of heat and pressure between the wiring pattern and the electrodes from the side of the wiring pattern or the side of the semiconductor element.

According to this method, the process of electrical connection is almost the same as the process in conventional TAB mounting. Therefore, where the processing equipment for TAB mounting is already installed, no new investment in equipment is required.

An insulating resin may be provided between the wiring pattern and the semiconductor element facing the wiring pattern before the step of electrical connection; and the insulating resin present between the wiring pattern and the semiconductor element may be hardened simultaneously with the electrical connection by the step of electrical connection.

According to this method, by the process of electrical connection, the insulating resin is simultaneously hardened, and therefore a separate step for hardening the insulating resin is not required. Therefore, by reduction of the number of steps, the ease of fabrication is improved, and the semiconductor assembly cost can be reduced.

The method of making a semiconductor device of the present invention comprises:

a step of preparing a film carrier tape, the film carrier tape comprising a substrate material and a wiring pattern formed on one of sides of the substrate material, the wiring pattern comprising a plurality of leads connected to a semiconductor element and a pad having an external connection terminal and formed integrally with each of the leads, a connection portion of each of the leads with the semiconductor element being adhered to the substrate material to be supported, and the substrate material having an opening for forming the external connection terminal at a position corresponding to the pad;

a step of positioning electrodes of the semiconductor element in a mounting region of the wiring pattern on a surface of the substrate material on which the wiring pattern is formed;

a step of electrically connecting the wiring pattern and the electrodes;

a step of providing a conducting material in the opening; and a step of stamping out the film carrier tape into a piece.

Since there is a step of providing a conducting material within an opening provided in the substrate material underneath the wiring pattern, a method is obtained of fabricating a semiconductor device having an area approximately equal to that of the active surface of the semiconductor element, directly below the active surface of the semiconductor element.

The step of providing the conducting material may be a step in which flux is applied to the opening, solder balls are disposed on the opening, and heat is applied.

According to this method, after applying flux to the opening, solder balls are disposed, and heat is applied, as a result of which external connection terminals of stable diameter can be formed. This is linked to increasing the stability of the external form of the semiconductor device, and results in a method of fabricating a semiconductor device of high reliability.

The step of providing the conducting material may be a step in which solder cream is applied to the opening, and then heat is applied.

According to this method, since after applying solder cream to the opening, heat is applied, by comparison with solder balls, inexpensive solder cream can be used, resulting in an inexpensive method of fabricating a semiconductor device.

Projections may be formed on at least one of the wiring pattern and the electrodes in such a manner as to face the other thereof; and the step of electrical connection may be achieved by the application of ultrasound to the projections from the side of the wiring pattern or the side of the semiconductor element.

For example, if ultrasound is used for bonding the wiring pattern and electrodes, the damage to the semiconductor element and substrate material by heat and pressure can be very greatly reduced. In this way, a semiconductor assembly of high reliability can be fabricated.

The mounted board of the present invention has mounted the above described semiconductor device.

By means of this structure, a board with a chip size package (CSP) semiconductor device mounted at high density is obtained, and even further compactness of a board with electronic components mounted can be achieved.

The electronic instrument of the present invention incorporates the above described mounted board.

By means of this structure, a board with a chip size package (CSP) semiconductor device mounted at high density is incorporated, and particularly for a portable electronic instrument or the like, an ultracompact lightweight result is achieved.

The method of making a semiconductor device of the present invention comprises:

a step of forming a wiring pattern on a substrate material having holes, the wiring pattern passing over the holes;

a step of opposing the wiring pattern formed on the substrate material to electrodes of a semiconductor element with a certain spacing therebetween, and connecting the wiring pattern and the electrodes through a conductive resin;

a step of injecting a resin between the substrate material and the semiconductor element, in a region avoiding the electrodes, to form a stress relieving portion; and a step of forming external connection terminals on the opposite surface of the substrate material from the wiring pattern, connected through the holes to the wiring pattern.

By means of the conductive resin, the facing wiring pattern and electrodes are connected, resin is injected, and a stress relieving portion is formed.

The method of making a semiconductor device of the present invention comprises:

a step of forming a wiring pattern on a substrate material having holes, the wiring pattern passing over the holes;

a step of providing a resin in regions corresponding to the holes and the vicinity thereof only, forming a stress relieving portion on the wiring pattern;

a step of providing a conductive resin on a portion of the wiring pattern;

a step of connecting the wiring pattern and electrodes of the semiconductor element through the conductive resin, with the stress relieving portion interposed between the wiring pattern and the semiconductor element; and a step of forming external connection terminals on the opposite surface of the substrate material from the wiring pattern, connected through the holes to the wiring pattern.

Since the stress relieving portion is formed only in the region of the external connection terminals and the vicinity thereof, the materials used can be kept to a minimum.

The conductive resin may be provided only in a region of the connection of the wiring pattern and the electrodes and the vicinity thereof.

Since the conductive resin is used to connect the wiring pattern and electrodes, by providing it only in the region where it is required, waste of materials can be avoided.

The method of making a semiconductor device of the present invention comprises:

a step of forming a wiring pattern on a substrate material having holes, the wiring pattern passing over the holes;

a step of bending the wiring pattern into the holes;

a step of opposing the wiring pattern formed on the substrate material to electrodes of a semiconductor element with a certain spacing therebetween, and connecting the wiring pattern and the electrodes through a conductive resin; and a step of forming external connection terminals on the opposite surface of the substrate material from the wiring pattern, connected through the holes to the wiring pattern.

Since the wiring pattern is subjected to bending processing so as to enter the holes, and since the external connection terminals are formed on these bent portions, stress applied to the external connection terminals can be absorbed by these bent portions.

The method of making a semiconductor device may further comprise a step of forming projections on the wiring pattern for connection to the electrodes of the semiconductor element.

By using these projections to connect to the electrodes, between the substrate material and the semiconductor element a gap for forming the stress relieving portion can be formed.

The conductive resin may be an anisotropic conducting film, and conducting particles included in the anisotropic conducting film may be pressed between the projections and the electrodes.

The anisotropic conductive film comprises a resin in sheet form with a conductive filler dispersed therein, and can be made conducting simply be being pressed.

The substrate material may be formed by cutting out a film carrier tape; the anisotropic conductive film may be in tape form and attached along the longitudinal direction of the film carrier tape; and the semiconductor element may be aligned and connected along the longitudinal direction of the film carrier tape.

By means of this, it is possible to attach the anisotropic conducting film along the longitudinal direction of the substrate material, and therefore the process can be automated. The semiconductor device can also be connected aligned along the longitudinal direction of the substrate material, and therefore waste of the anisotropic conductive film is reduced.

The circuit board of the present invention has the above described semiconductor device and a substrate on which a desired wiring pattern is formed; and external connection terminals of the semiconductor device are connected to the wiring pattern.

The electronic instrument of the present invention has the above described circuit board.

BRIEF DESCRIPTION OF THE DRAWINGS

FIG. 30 shows a fabrication process of a ninth embodiment of the semiconductor device;

BEST MODE FOR CARRYING OUT THE INVENTION

The present invention is now described in terms of a number of preferred embodiments, with reference to the drawings.

First Embodiment

In this embodiment, tape automated bonding (TAB) technology is used in implementing the fabrication of a chip-sized semiconductor device. In the process of this embodiment, as far as possible an existing TAB production line and existing technology are used, reducing the burden of equipment and the development burden of special technology, and fabricating a chip-size package with high reliability, while increasing the yield.

Principal Characteristics of the Embodiment

Before discussing the embodiment in detail, principal characteristics thereof are described with reference to FIGS. 1 to 2C.

Figure 1:
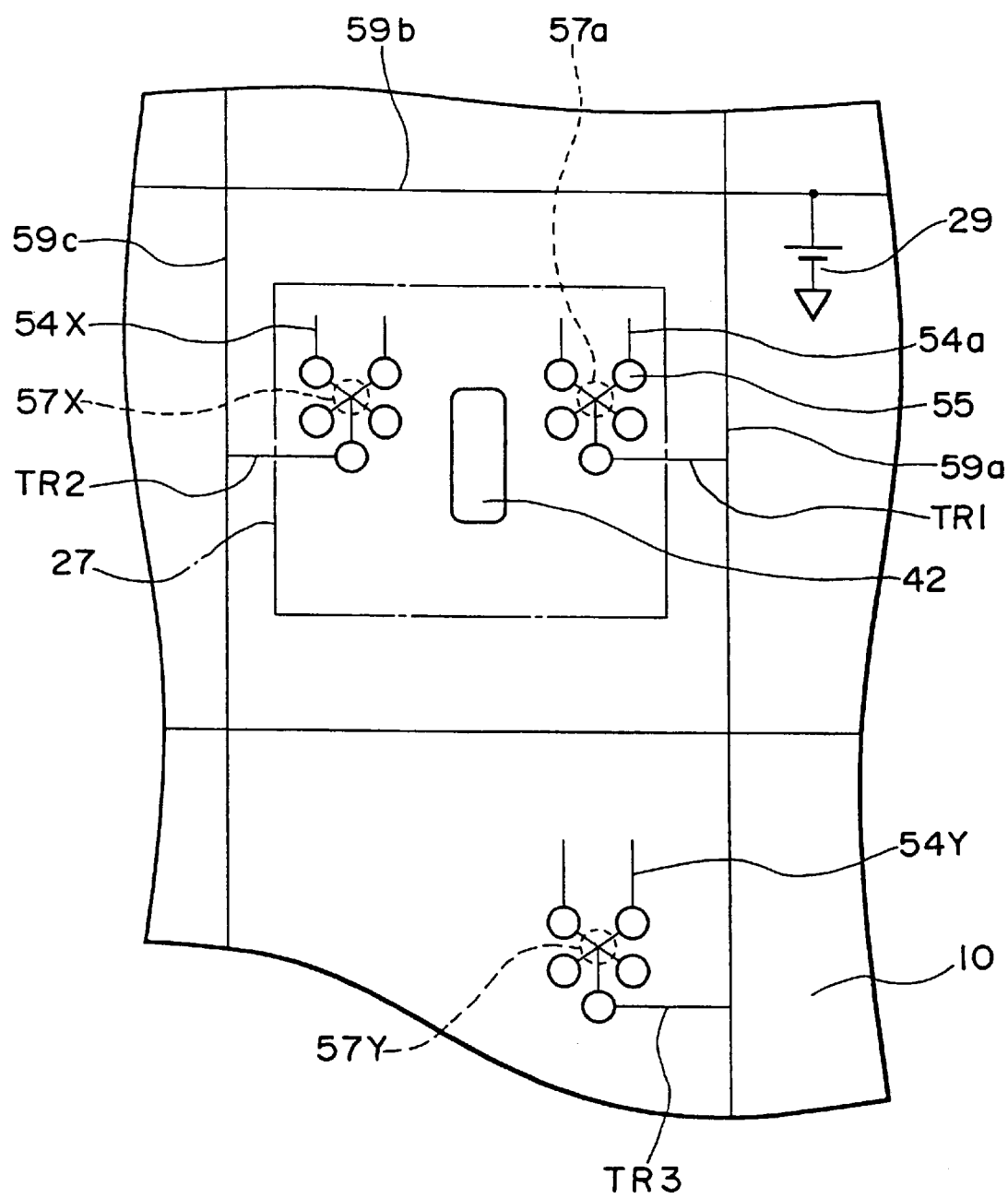
FIG. 1 is an explanatory diagram showing characteristics of the method of manufacture of a film carrier tape (method of manufacture of a semiconductor device) of the present invention.

As shown in FIG. 1, on a substrate of a polyimide film 10 in which are provided certain openings, such as for example a resin injection hole 42 (not essential but may be formed as required), and through holes (opening for forming external connection terminals), is provided a pattern formed by etching of a copper film. (The through holes are not shown in FIG. 1.)

This pattern comprises a frame 59a, 59b, and 59c, leads (54a, 54x, 54y, and so forth), pads 55 having conducting projections (external connection terminals) formed either integrally or separately, a plurality of links (57a, 57x, 57y, and so forth) mutually linking the leads (and pads), and suspension leads (TR1 to TR3, and so forth) electrically connection the frame and leads.

It should be noted that it is not essential that the pads are formed with electrically conducting projections (external connection terminals), and according to requirements projections may be equally be formed on the mounting side, that is, on a motherboard, for example.

Even in the case that the pads are formed with electrically conducting projections (external connection terminals), they may equally be formed in advance when the tape is formed, or at a later stage, such as for example during the formation of the package, or at a later stage.

The extremities of the leads (54a, 54x, 54y, and so forth) are arranged to connect to the IC chip (semiconductor element), and are sometimes termed "fingers." It should be noted that the fact that the lead is connected at its extremity to an IC chip is not an essential part of the present invention, and the connection may equally be made at a portion of the lead other than the extremity.

In this embodiment, each finger is terminated on the polyimide film 10, and is a free end. In other words, through the whole process from before the step in which a finger is formed until after the step of connection to an IC chip, the finger is supported on the polyimide film.

In other words, the portion of the lead (finger) to be connected to an IC chip electrode is supported by being adhered to the polyimide film.

Since even in the step of connection of the lead to the IC chip the previously designed finger position is maintained, accurate positioning of the lead and the IC chip is possible. As described below, it is not essential that the finger is a free end, and it may extend outward from a CSP end 27 (this is the boundary for cutting away from the polyimide film) for direct individual connection to the frame 59b.

However, in the case of this embodiment, in order to carry out electroplating in a single operation on all of the plurality of leads (54a and so forth) which are formed on the electrically insulating film of polyimide or the like, it is necessary for all of the leads to be connected to the frame (59a, 59b, and 59c). Here, in this embodiment, the plurality of links (57a, 57x, 57y, and so forth) are disposed within the area of mounting the semiconductor chip, and link a number of leads (at least two leads) within the area of mounting the semiconductor chip, and through the links (57a, 57x, 57y, and so forth) electrical connections to the frame 59a, 59b, and 59c are made. By this means, by connecting the frame 59a, 59b, and 59c to a cathode of for example a battery 29, electroplating of the conductor pattern including the leads (54a and so forth) can be carried out in a single operation. It should be noted that the "area of mounting the semiconductor chip" and the "mounting area of a single IC chip" both correspond substantially to the CSP end 27 outlined by a dot-dash line in FIG. 1.

When the links (57a, 57x, 57y, and so forth) are no longer needed, they are cut away by die stamping, together with the insulating film, so that the leads (54a, 54x, 54y, and so forth) are electrically isolated. This die stamping can be carried out in a single operation, and does not complicate the fabrication process. It should be noted that without cutting out the insulating film, in order simply to provide electrical isolation of the leads, it is sufficient to cut out the links. The links (57a, 57x, 57y, and so forth) are disposed within the mounting area of a single IC chip kept inside the area, and are therefore away from the extremities (fingers) of the leads positioned at the boundary of the chip mounting area. As a result, cutting of the links (57a, 57x, 57y, and so forth) has no effect on the lead extremities (fingers).

As described below, in the case of carrying out electroless plating, the links, frame, and links are not required.

In this way, without making the fabrication process more complicated, a film carrier tap for which lead bending is prevented, and reliable bonding is made possible can be provided. When electroplating is used, it can be carried out in a single operation.

Figure 2C:
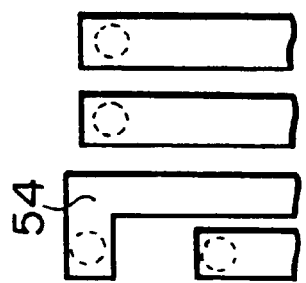
FIGS. 2A to 2C are explanatory diagrams showing further characteristics of the method of manufacture of a film carrier tape (method of manufacture of a semiconductor device) of the present invention.
Figure 2B:
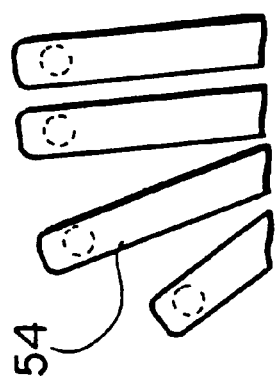
Figure 2A:
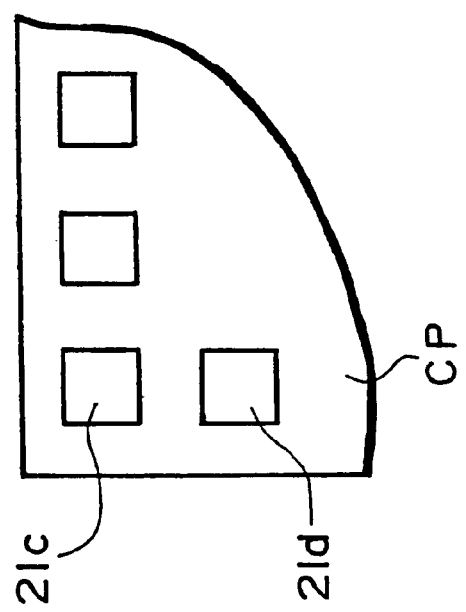

FIGS. 2A to 2C show enlarged portions of fingers corresponding to bonding pads of an IC chip, and as shown here, in order to correspond with the positions of the bonding pads of the IC chip, in some cases it may be necessary for a plurality of the extremities (fingers) of the leads to be positioned on a single line. For example, as shown in FIG. 2A, bonding pads 21c and 21d of the IC chip (CP) are on the same line.

In a case such as this, it is necessary for the leads 54 to be in a radiating pattern as shown in FIG. 2B, or to be bent as shown in FIG. 2C.

In the conventional technology, the fingers are formed in holes (openings) formed in the polyimide film 10. In this formation, a radiating pattern of leads does not fit with a rectangular coordinate system, and led to problems in the fabrication of the film carrier tape. Again, if within an opening the ends of the leads are bent, there is an unwanted moment due to gravity, and twisting of the leads was liable to occur. In the present invention, the fingers are all formed on the polyimide film, as a result of which without special design, according to the forms described above, the fingers can be formed to correspond with the positions of any form of bonding pads.

DETAILED DESCRIPTION OF THE EMBODIMENT

Figure 13:
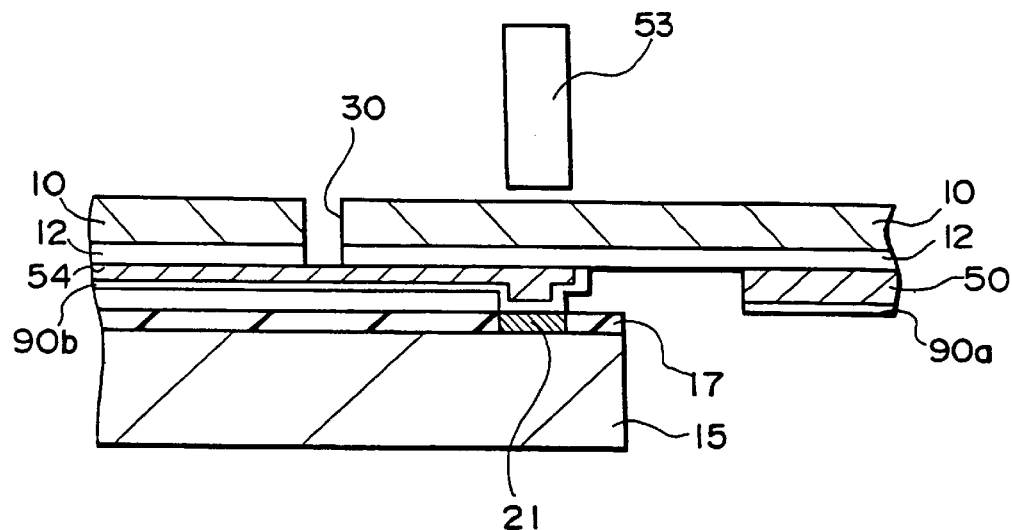
FIG. 13 is a cross-sectional view of a film carrier tape and semiconductor chip showing a tenth step in the method of manufacture of a semiconductor device of the present invention.
Figure 14:
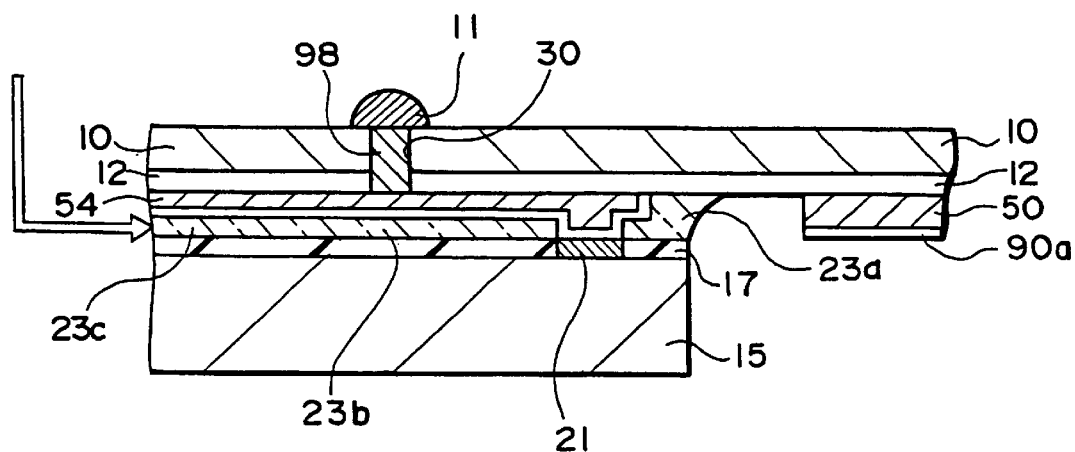
FIG. 14 is a cross-sectional view of a film carrier tape and semiconductor chip showing an eleventh step in the method of manufacture of a semiconductor device of the present invention.
Figure 15:
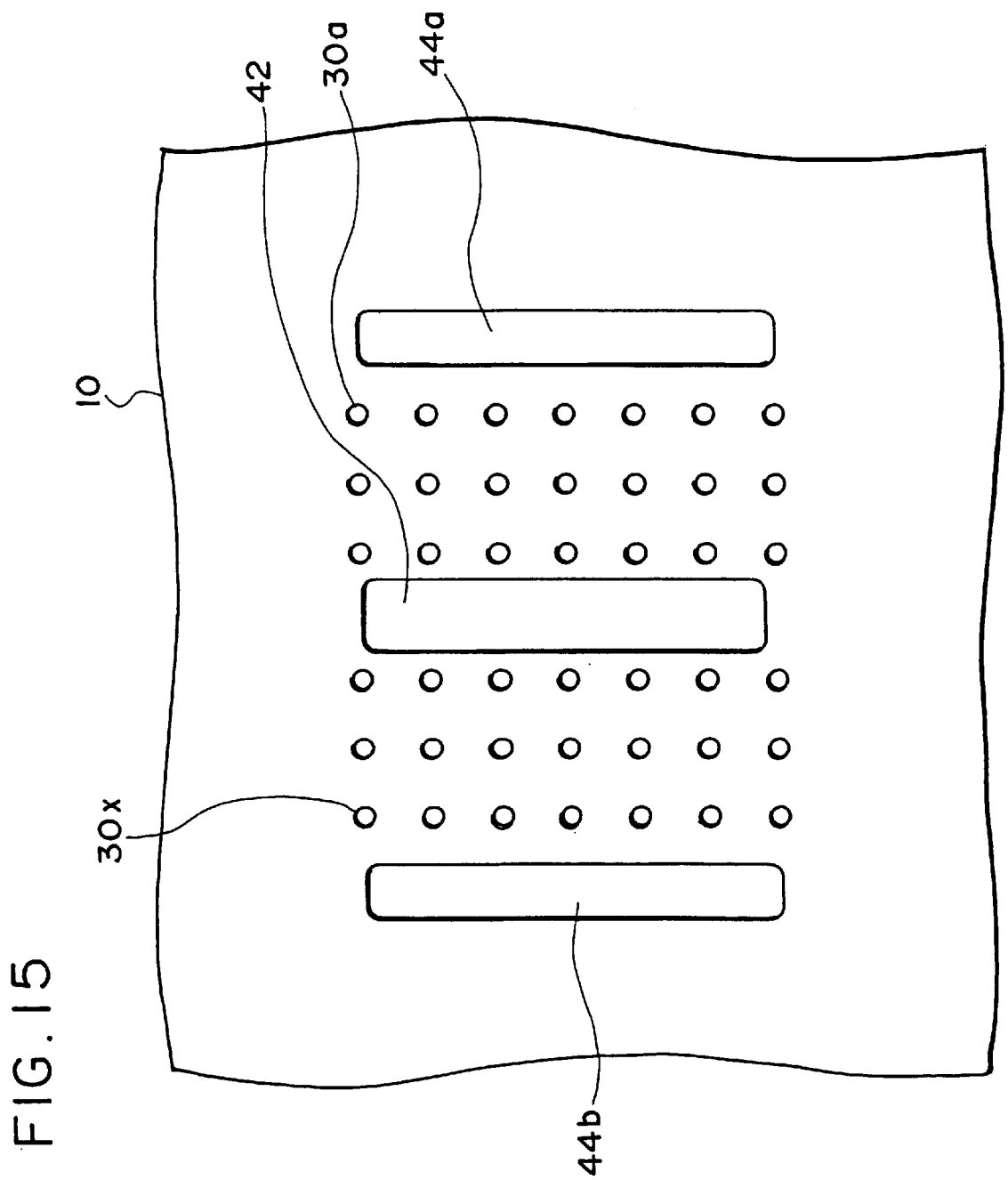
FIG. 15 is a plan view of the film carrier tape in the step of FIG. 4.

Next this embodiment of the method of manufacture of a semiconductor device is described specifically, with reference to FIGS. 3 to 14 (sectional views) and FIGS. 15 to 19 (plan views). FIG. 15 corresponds to FIG. 4, FIG. 16 corresponds to FIG. 7, FIG. 17 corresponds to FIG. 12, and FIG. 18 corresponds to FIG. 13.

Step 1

Figure 3:
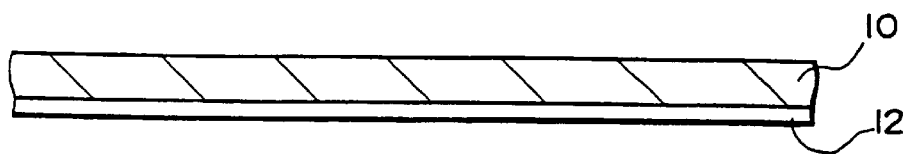
FIG. 3 is a cross-sectional view of a film carrier tape showing a first step in the method of manufacture of a semiconductor device of the present invention.

As shown in FIG. 3, an adhesive 12 is applied to the reverse side of the polyimide film 10.

Step 2

Figure 4:
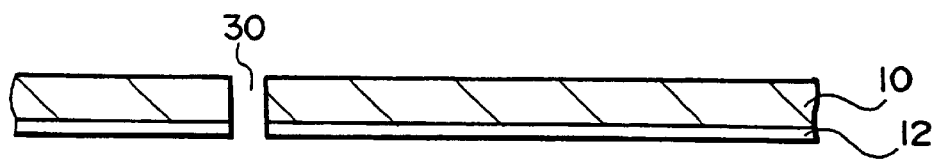
FIG. 4 is a cross-sectional view of a film carrier tape showing a second step in the method of manufacture of a semiconductor device of the present invention.

Using a means such as press cutting, laser machining, or chemical etching, as shown in FIGS. 4 and 15, openings are selectively formed in the polyimide film 10, to provide via holes 30 (30a, 30x, and so forth). Also, as required, a resin injection hole (42), and resin stopping holes (44a, 44b) are provided.

Step 3

Figure 5:
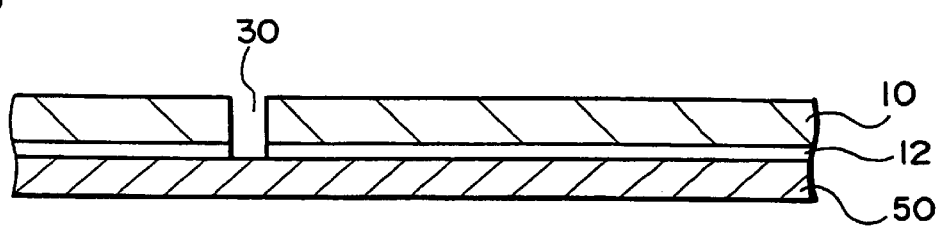
FIG. 5 is a cross-sectional view of a film carrier tape showing a third step in the method of manufacture of a semiconductor device of the present invention.

As shown in FIG. 5, a copper film 50 is applied to one side of the polyimide film 10. The copper film 50 is later used as a metallic material for a wiring pattern, bumps, and so on.

Here, in step 2 before applying the copper, film openings are formed, but the process is not limited to this, and the openings may equally be formed after applying the copper film.

According to this method, there is no longer a step of handling a tape to which is applied not yet hardened adhesive, which is troublesome, and the step is one of handling a tape for which the adhesive hardening has ended and the application of the metal wiring pattern has ended, so that to a certain extent the handling may be rough. Moreover, the process is not limited, and there is the effect that the degree of process freedom of the opening forming process is increased. In this case, since, without forming openings in a copper film after the copper film is applied, openings are formed in the polyimide film, a means such as laser machining, chemical etching, or the like which does not affect other than the polyimide film is used.

Step 4

Figure 6:
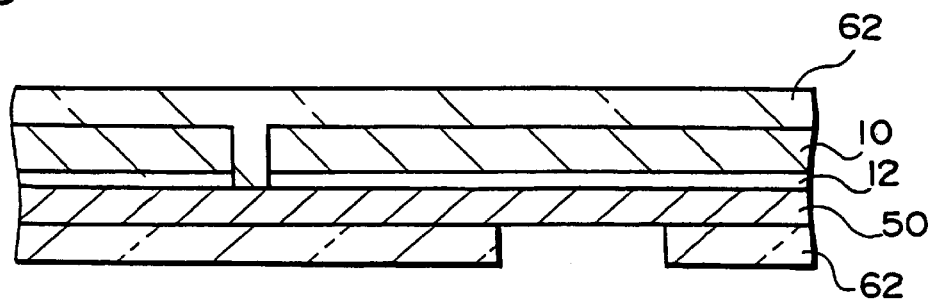
FIG. 6 is a cross-sectional view of a film carrier tape showing a fourth step in the method of manufacture of a semiconductor device of the present invention.

As shown in FIG. 6, a photoresist layer 62 is formed on the copper film 50.

Step 5

Figure 7:
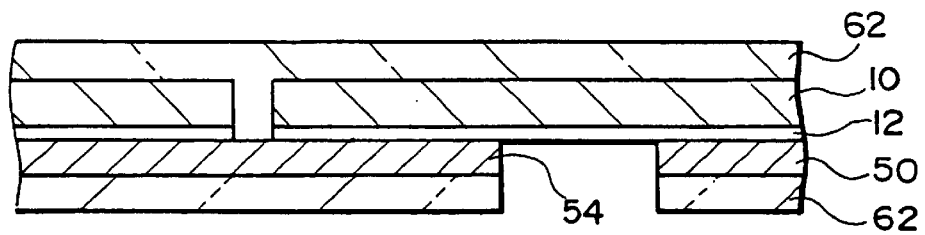
FIG. 7 is a cross-sectional view of a film carrier tape showing a fifth step in the method of manufacture of a semiconductor device of the present invention.

As shown in FIG. 7, the copper film 50 is etched to form a particular pattern, after which the photoresist layer 62 is removed. For the etching, a known etchant (for example, ferric chloride, or cupric chloride) is used. This state is shown in plan view in FIG. 16.

Figure 16:
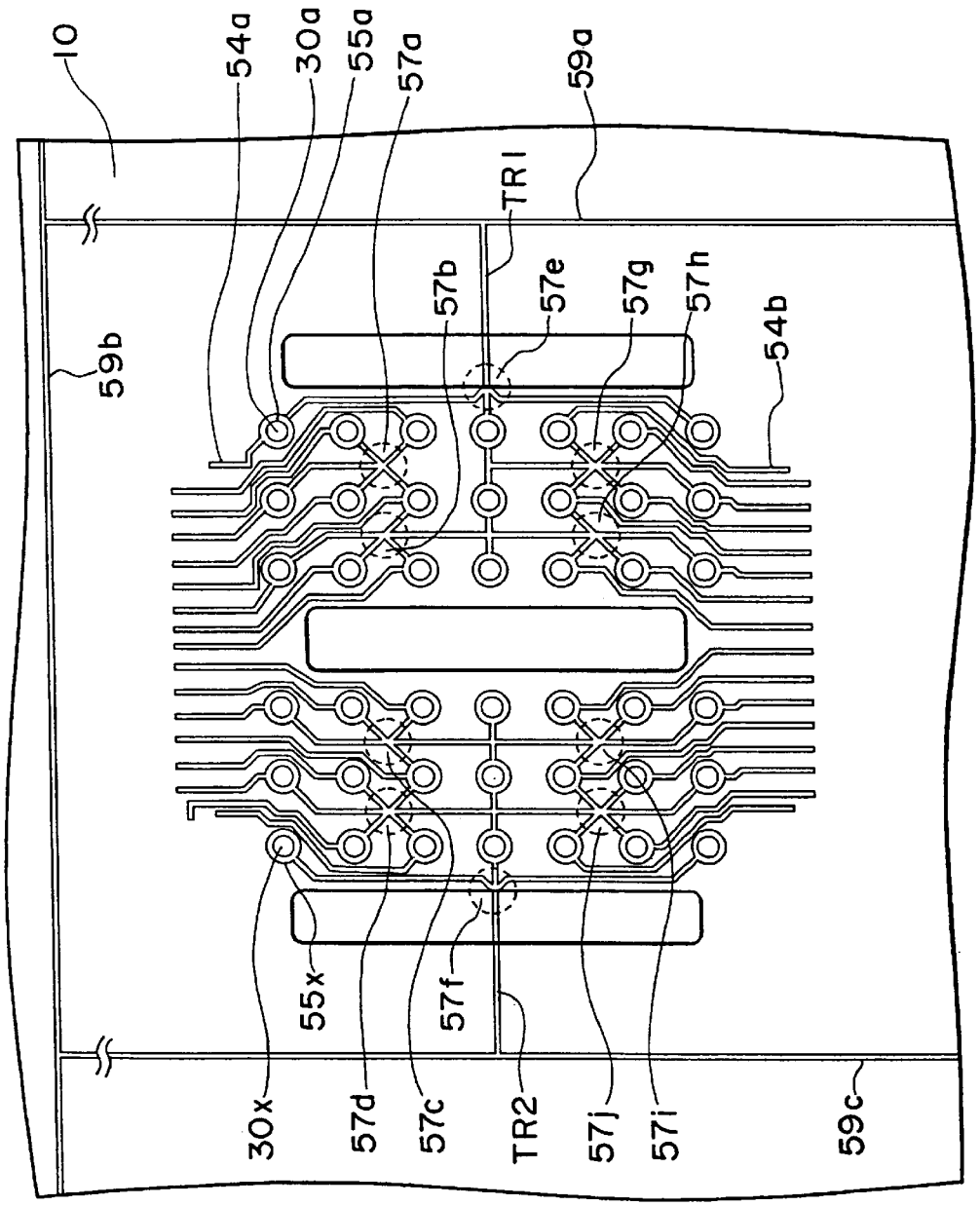
FIG. 16 is a plan view of the film carrier tape in the step of FIG. 8.

As shown in FIG. 16, the pattern of copper comprises a frame 59a, 59b, and 59c, leads (54a, 54b, and so forth), pads (55a, 55x, and so forth) for connecting conducting projections, and links (57a to 57j). In FIG. 16, portions being the same as portions already described in FIGS. 1, 2A to 2C, and 21 are given the same reference numerals.

Step 6

Figure 8:
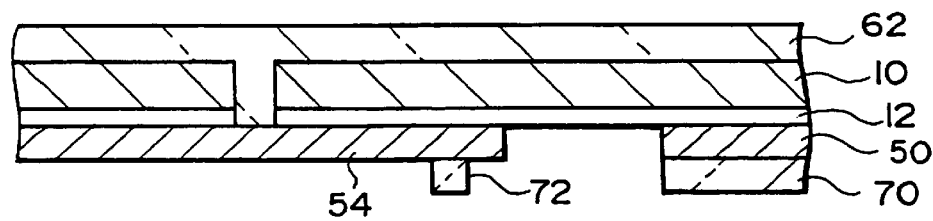
FIG. 8 is a cross-sectional view of a film carrier tape showing a sixth step in the method of manufacture of a semiconductor device of the present invention.

In order to make the extremities (the portions connecting to the IC chip, the fingers) of the leads 54a and so forth project, and to form bumps for connection (FIG. 10), first as shown in FIG. 8, photoresist layers 70 and 72, are formed.

Step 7

Figure 9:
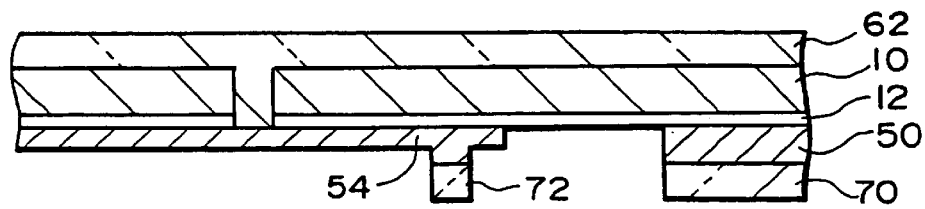
FIG. 9 is a cross-sectional view of a film carrier tape showing a seventh step in the method of manufacture of a semiconductor device of the present invention.

As shown in FIG. 9, the copper pattern is half-etched in the thickness direction. The etching is carried out in the same way as in step 5, with the time reduced.

Step 8

Figure 10:
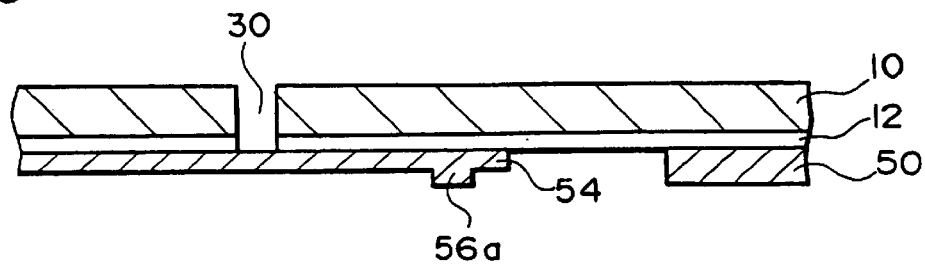
FIG. 10 is a cross-sectional view of a film carrier tape showing a eighth step in the method of manufacture of a semiconductor device of the present invention.

As shown in FIG. 10, the photoresist layers 70 and 72 are removed. As shown in the drawing, at the extremities (the portions connecting to the IC chip, the fingers) of the leads 54a and so forth are formed projections 56a.

It should be noted that at this time, portions other than the fingers may also have projections formed appropriately (not shown in the drawing). These projections are used to ensure a gap between the copper pattern and the IC chip for filling with the resin.

In the normal TAB step, for connection of the TAB leads and the semiconductor chip, metallic bumps (projections) are formed on the semiconductor chip, but the formation of these bumps is considerably troublesome, and has moreover generally tended to lead to a high manufacturing cost.

This embodiment is one in which, in place of forming bumps on the semiconductor chip, bumps (projections) are formed on the TAB leads. The technology for forming these lead extremities, in the conventional technology in which fingers are formed in openings cut out from the polyimide film, is an established technology already developed by the present applicant, and allows an existing TAB production line to be used. In this embodiment, the technology for processing these lead extremities is developed, and this technology is also applied to the leads on the polyimide film. In this case, the aluminum pads on the semiconductor chip may simply be exposed, and the process can be simplified since the metallic bumps are not required, and indeed this is technology which will make a large contribution to the reduction of the overall cost of a semiconductor device.

Step 9

Figure 11:
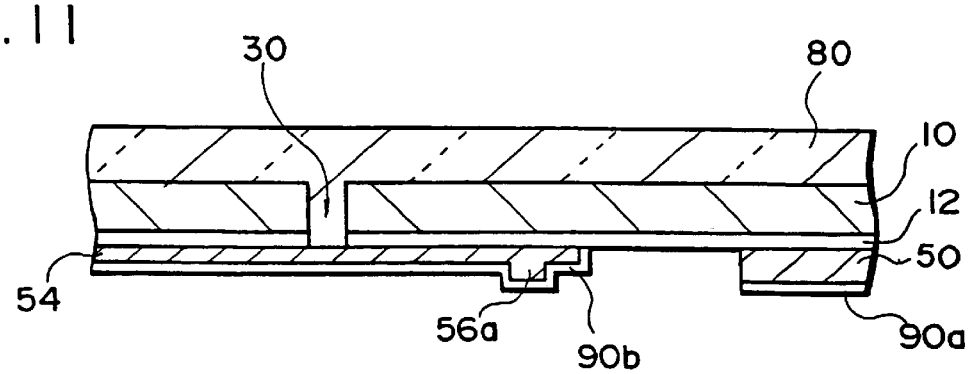
FIG. 11 is a cross-sectional view of a film carrier tape showing a ninth step in the method of manufacture of a semiconductor device of the present invention.

As shown in FIG. 11, after resist layers 80a and 80b are formed on the surface of the copper pattern, electroplating is applied to the reverse surface of the copper pattern, and nickel/gold plated layers (90a to 90b) are formed. The nickel functions as a barrier metal. When there is a requirement for reliability or in the case of assembly and mounting processes in which copper diffusion is not a problem, plating with gold only may equally be used. This electroplating, as also described in FIG. 1, is carried out by applying a voltage to the frame 59a to 59c. For example, one electrode (generally the cathode) is connected to the frame to allow a unified operation.

It should be noted that this is not restricted to electroplating. For example, electroless plating may be used to carry out the plating of the conductor pattern.

Step 10

Figure 12:
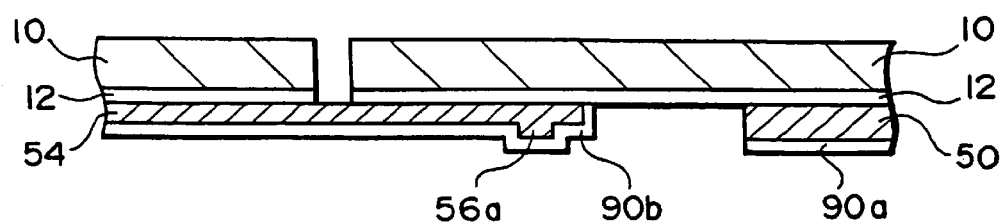
FIG. 12 is a cross-sectional view of a film carrier tape showing a ninth step in the method of manufacture of a semiconductor device of the present invention.
Figure 17:
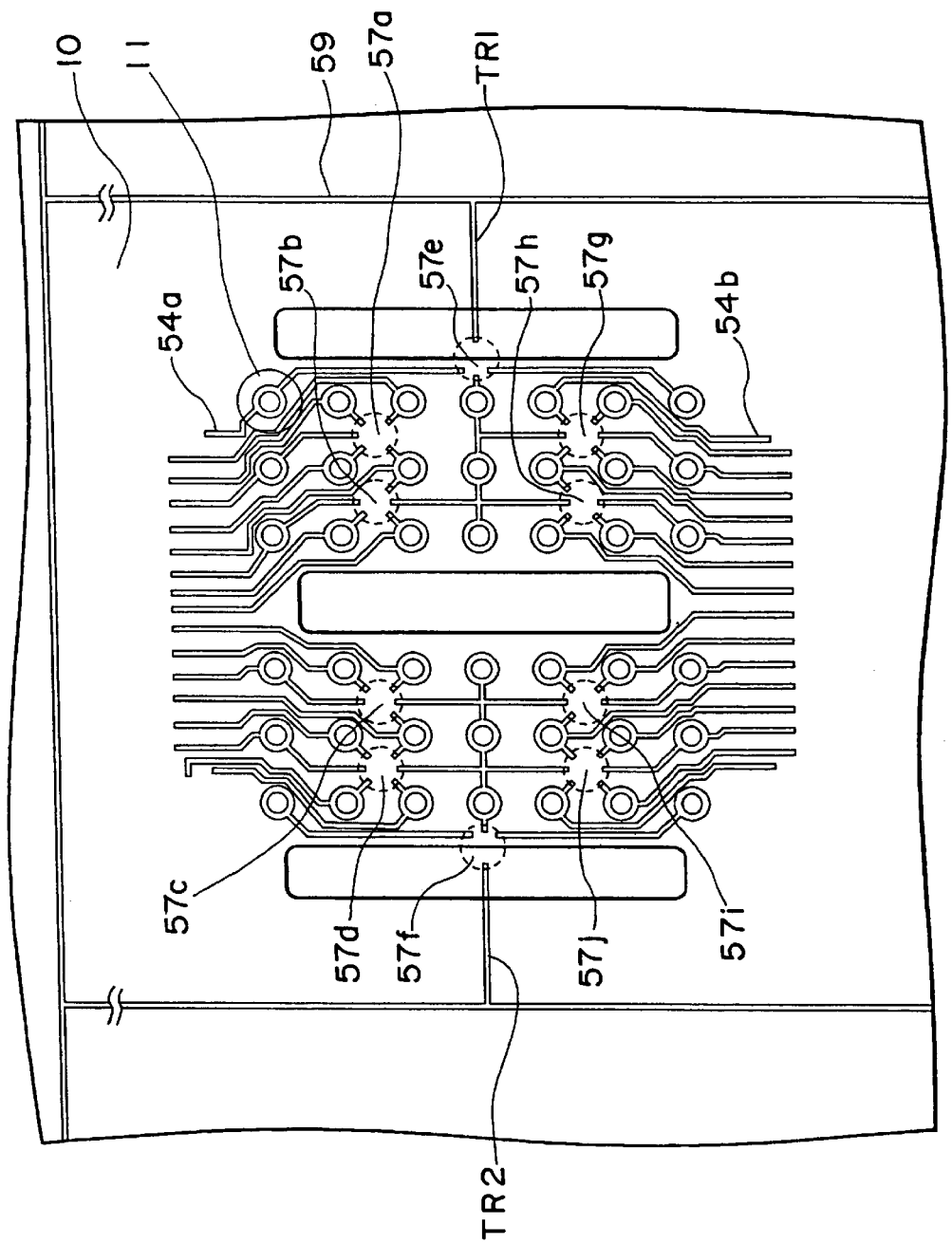
FIG. 17 is a plan view of the film carrier tape in the step of FIG. 12.

First, as shown in FIG. 12, the resist 80 of the previous step is removed, and next as shown in FIG. 17, die stamping of the links 57a to 57j is carried out. By this means, the leads 54a and so forth are electrically isolated. At this point the film carrier tape for the CSP is completed (FIG. 17). Although not shown in detail in FIG. 17, in this embodiment, projections 56a are formed on the leads 54 (see FIG. 10).

It should be noted that if electroless plating is used, the leads may be electrically isolated, and therefore the links 57a to 57j are not required, and therefore the die stamping need not be carried out.

Step 11

Figure 18:
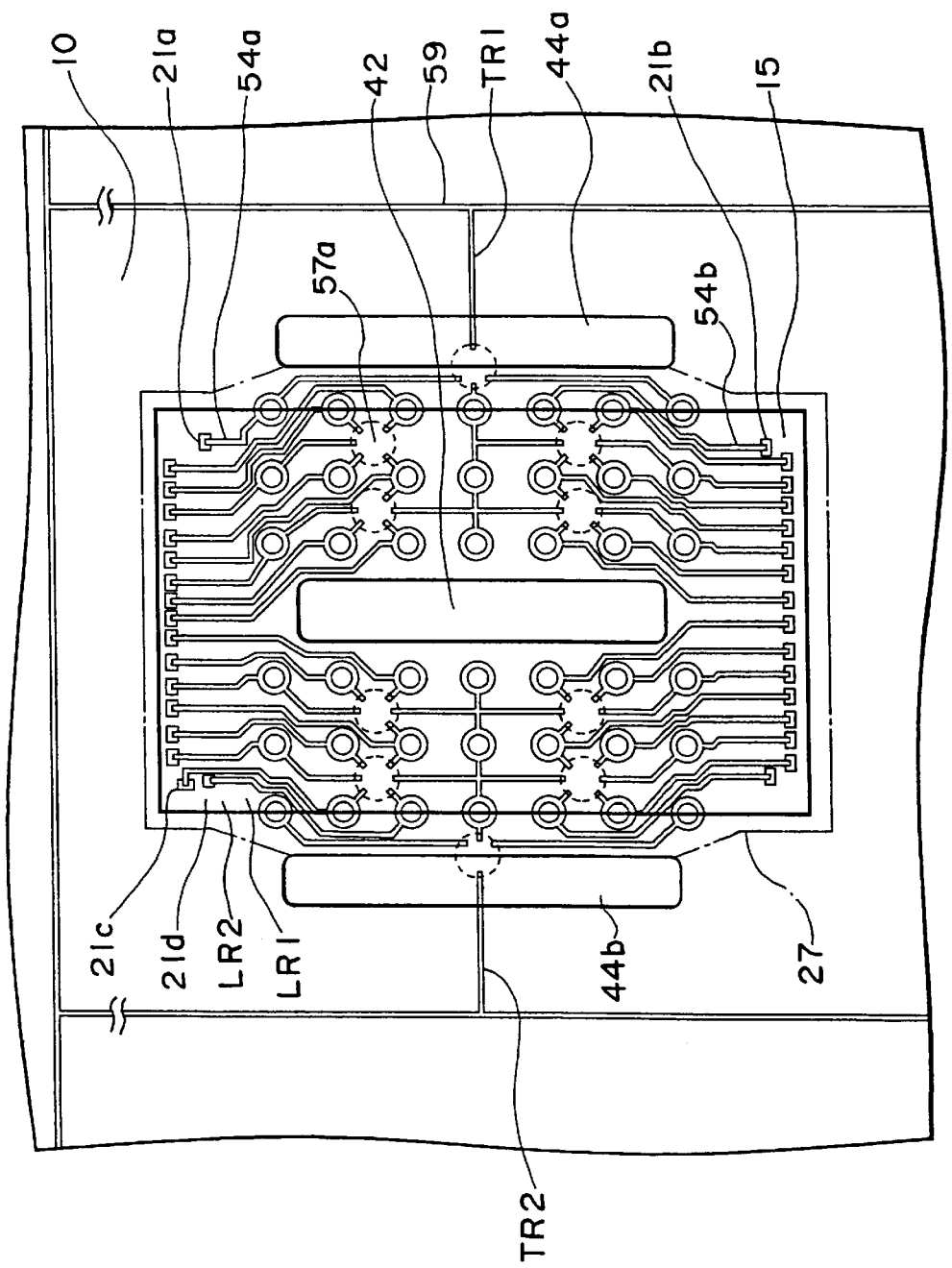
FIG. 18 is a plan view (transparent view) of the film carrier tape in the step of FIG. 13.

Next, as shown in FIGS. 13 and 18, the aluminum electrodes (bonding pads) 21 (21a to 21d, and so forth) of an IC chip 15 are connected to the connecting portions of the leads. This connection is carried out by applying ultrasound vibration while applying pressure from the bonding tool 53 to the projections 56a of the lead extremities, to create a gold-aluminum alloy (application of fusion energy). It should be noted that in this embodiment, a BTAB type tape is used, in which projections 56 are formed on the leads 54 of the film carrier tape, but a tape without the projections 56 may also be used. In this case, bumps of gold solder or the like may be formed on the aluminum electrodes (bonding pads) 21 of the IC chip 15. Both the projections 56 of the leads 54 and the projections (bumps) of the aluminum electrodes 21 may be provided.

In FIG. 18, a heavy line indicates the IC chip 15 shown in FIG. 13. The application of ultrasound vibration may be carried out from the reverse side of the IC chip.

Furthermore, if a metal such as solder, gold, or the like, which has good brazing characteristics is adhered on the aluminum electrodes (bonding pads) 21 (21a to 21d, and so forth), then the energy application may be principally by the application of pressure and heat, and the application of ultrasound vibration is not required, or only weak application may be used. By the application for an extremely short time (for example 2 seconds) of a high temperature (for example at least 500 degrees C.) to the unaltered aluminum electrodes (bonding pads) 21, a connection similar to that described above may be carried out.

Step 12

As described above, with respect to the material having the aluminum electrodes 21 of the IC chip 15 and the projections 56a of the leads 54 metal bonded, as shown in FIG. 14, a resin, for example an epoxy resin, is injected through a resin injection hole (reference numeral 42 in FIG. 18). It should be noted that in the above described step, the case in which ultrasound is used on the metal bonding of the aluminum electrodes 21 and the projections 56a is also similar. Also, in the case in which the resin injection hole is not present (not provided), the gap existing between the IC chip and the film may be used for resin injection.

The resin covers the whole of the portion of connection of the IC chip 15 and the leads (54a and so forth). On the other hand, the resin stopping holes 44a and 44b by their existence restrict the lateral spread. In FIG. 14, reference numerals 23a, 23b, and 23c indicate a resin coating. If an epoxy resin is used, it not only functions as an insulating resin exhibiting high electrical insulation characteristics, but also functions as a stress absorbing layer.

It should be noted that as the resin, other than an epoxy resin, a photosensitive polyimide resin, a silicone denatured polyimide resin, an epoxy resin, or a silicone denatured epoxy resin, or the like, being a material with a stress relieving function having a low Young's modulus (not exceeding $1 \times 10^{10}$ Pa) when solidified, may be used.

Next the injected resin is hardened. At this time, the holes formed in the polyimide film 10 when the links (57a to 57j) were formed by die stamping in step 10, may act as gas escape holes for steam and the like generated by heating of the package, and assist in improving the reliability of the package. However, if the die stamping of the links is not required, for example because electroless plating is used, then this is not a limitation.

The injection of the resin may be carried out after the adherence of the IC chip and the film carrier tape described above, or an epoxy resin may be previously applied to the film carrier tape and the IC chip adhered. The application of the resin may equally be carried out on the IC chip. In this way, since the injection of resin is no longer necessary, a general purpose material may be selected not having special characteristics of injection, and this may be linked to a cost reduction in the semiconductor assembly and semiconductor device. Again, since the resin injection hole (reference number 42 in FIG. 18) is rendered unnecessary, the die stamping of the polyimide tape is not required, and the semiconductor assembly and semiconductor device may be formed at low cost.

As the resin may be used a polyimide based or silicon based resin, having a high stress absorbing effect. In this case the hardening may me carried out according to the hardening mechanism of the particular resin, and by this step, the active surface of the IC chip, the aluminum electrodes, and so forth, which are mechanically and chemically weak portions are covered by resin, as a result of which transportation between process steps and between factories can be carried out safely. This form is referred to as a "semiconductor assembly". The formation of external connection terminals carried out in this and the following steps carries a high risk of contamination of the active surface of the IC chip, aluminum electrodes, and so forth, and therefore if the semiconductor assembly is moved to a different process the reliability of the overall semiconductor device completed hereafter can be improved. By means of the above process, a semiconductor assembly using a film carrier tape to which are adhere a plurality of IC chips is fabricated. It goes without saying that shipment to a customer can occur in this state.

Next, within via holes 30 a metal (nickel) or the like 98 is inserted by plating, printing, or another method, and next external connection terminals (solder balls) 11 are formed. It should be noted that in order to obtain height precision, the nickel or other metal 98 is inserted in the via holes 30, but from the point of view of reducing the number of fabrication steps, it is possible to fill the via holes 30 with solder and form the external connection terminals 11 in a single operation. In this case, on the copper pattern within the via holes 30, it is preferable from the point of view of solder wettability, after having previously removed the resist in step 10, to then carry out the electroplating in step 9. As for the solder, after applying flux to the via holes 30, solder balls are placed thereon, and heated to form the external connection terminals (solder balls) 11. Alternatively, after solder cream is applied to the via holes 30, by heating the external connection terminals (solder balls) 11 are formed. In this way, it is no longer necessary to purchase expensive solder balls, and this can contribute to the low cost of the semiconductor device.

In this way, the IC chip 15 and the connection portion of the leads 54 and the IC chip 15 are covered by epoxy resin or other resin before the external connection terminals 11 are provided, so that during the formation of the external connection terminals 11 there is no worry of the chip area being contaminated, and therefore the beneficial aspect that the reliability is increased.

It should be noted that in the above example, as shown in FIG. 14, before the external connection terminals 11 are formed, the semiconductor device is fabricated through the steps of FIGS. 12 and 13, but this is not a limitation.

For example, before the resin sealing step of FIG. 14 (step 10 and so forth), the external connection terminals 11 may be formed. (The method of formation as previously described.) In this way, a semiconductor assembly with the external connection terminals 11 or a flexible tape for a semiconductor assembly can be shipped to a customer.

Step 13

Figure 19:
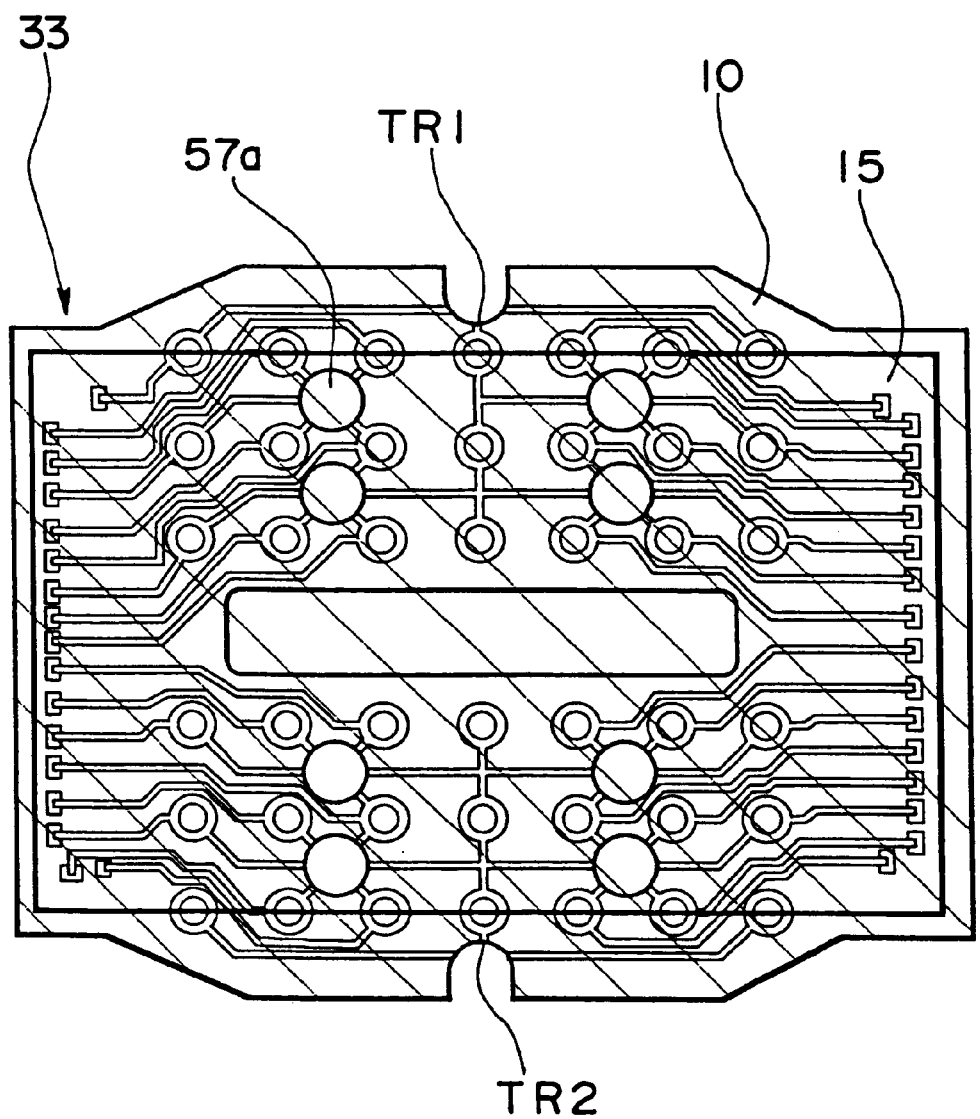
FIG. 19 is a plan view (transparent view) of the cut-out semiconductor of the present invention.

The insulating film 10 is cut by die stamping along the CSP end 27 shown surrounded by a dot-dash line in FIG. 18. By this means a chip-size semiconductor device (CSP) 33 as shown in FIG. 19 is completed. In FIG. 19, the hatched area is the area covered by resin.

As shown in the drawings, only the cut surface of the suspension leads TR1 and TR2 are exposed, and the damp resistance is excellent. Also because it takes the form of a package, burn-in and other testing is possible.

It should be noted that in the above example an example of the fabrication of a film carrier tape using an adhesive 12 has been described, but this embodiment of the film carrier tape may equally be fabricated to form the already known a film carrier tape without using an adhesive, using the so-called two-layer TAB technology. A film carrier tape using a two-layer conductor layer may equally be used. In this case, if one layer is used as a ground plane layer, a package supporting high frequency characteristics can be provided.

In the above embodiment, the copper pattern is formed on the reverse side of the insulating film 10, but this is not limitative, and application of the same method of manufacture is also possible when formed on the front side of the insulating film 10, and moreover a similar benefit is obtained.

As described below, a can container may be used to improve the heat radiation and reliability characteristics.

Second Embodiment

Figure 20:
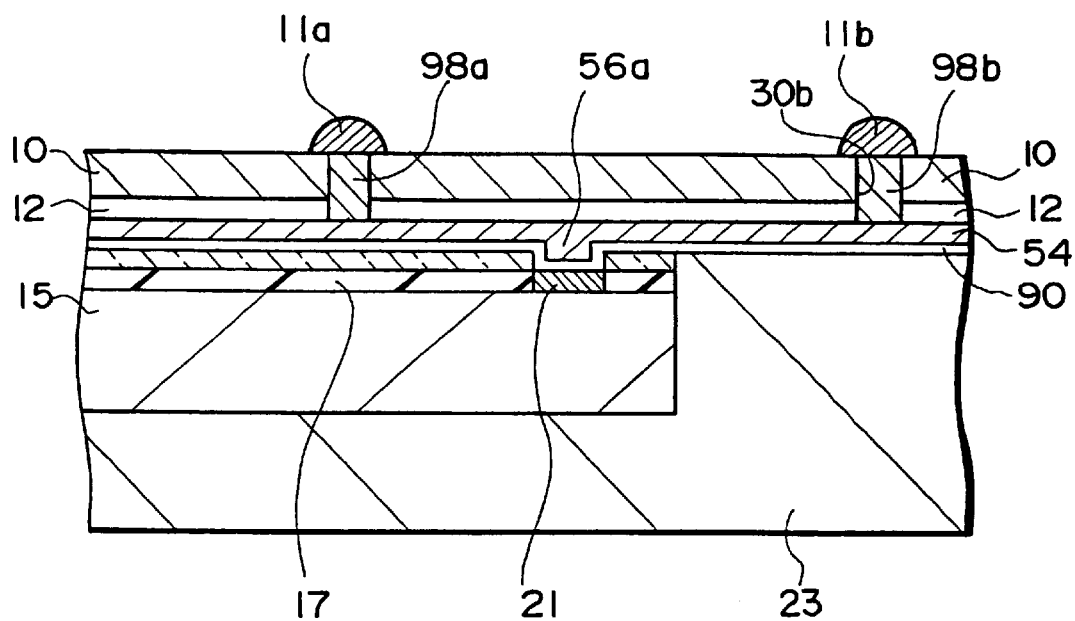
FIG. 20 is a cross-sectional view of a variant example of the semiconductor device of the present invention.

As shown in FIG. 20, not only the external connection terminals 11a in the interior of the IC chip 15, but external connection terminals (solder balls) 11b may also be formed on the exterior.

In this embodiment, the IC chip 15 is disposed within a can container 23, and leads 54 extend over the can container 23. If for the can container is used a material having good thermal conductivity, such as for example a copper-based material, then since the can container is adhered to the reverse side of the IC chip 15, heat emitted by the IC chip 15 can be conducted to the can container 23, and since further the reverse side of the IC chip 15 is mechanically protected, this is used for heat radiation and reliability improvement.

Then metal electrodes 98b are formed within the via holes 30b, and solder balls 11b are connected to these metal electrodes 98b. Naturally, formation in a single operation using only solder balls as described above is also possible.

In FIG. 20, an example in which the same leads 54 are connected to inner and outer external connection terminals (solder balls) 11a and 11b is shown in the drawing, but of course according to the requirements for the aluminum electrodes (bonding pads) 21, may be connected only on the inner side or may be connected only on the outer side. In this case, as in FIG. 20 the leads 54 may intersect the connection portion with the aluminum electrodes 21, and as in the first embodiment may be terminated on the polyimide film 10, as free ends (from both inner and outer, or one only thereof).

According to this embodiment, with no restrictions from the size of the IC chip 15, the number of external connection terminals (solder balls) can be freely increased.

To save cost, the can container 23 may of course not be used. As for the fabrication of a semiconductor assembly, the first embodiment can be applied almost without alternation.

Third Embodiment

Figure 21:
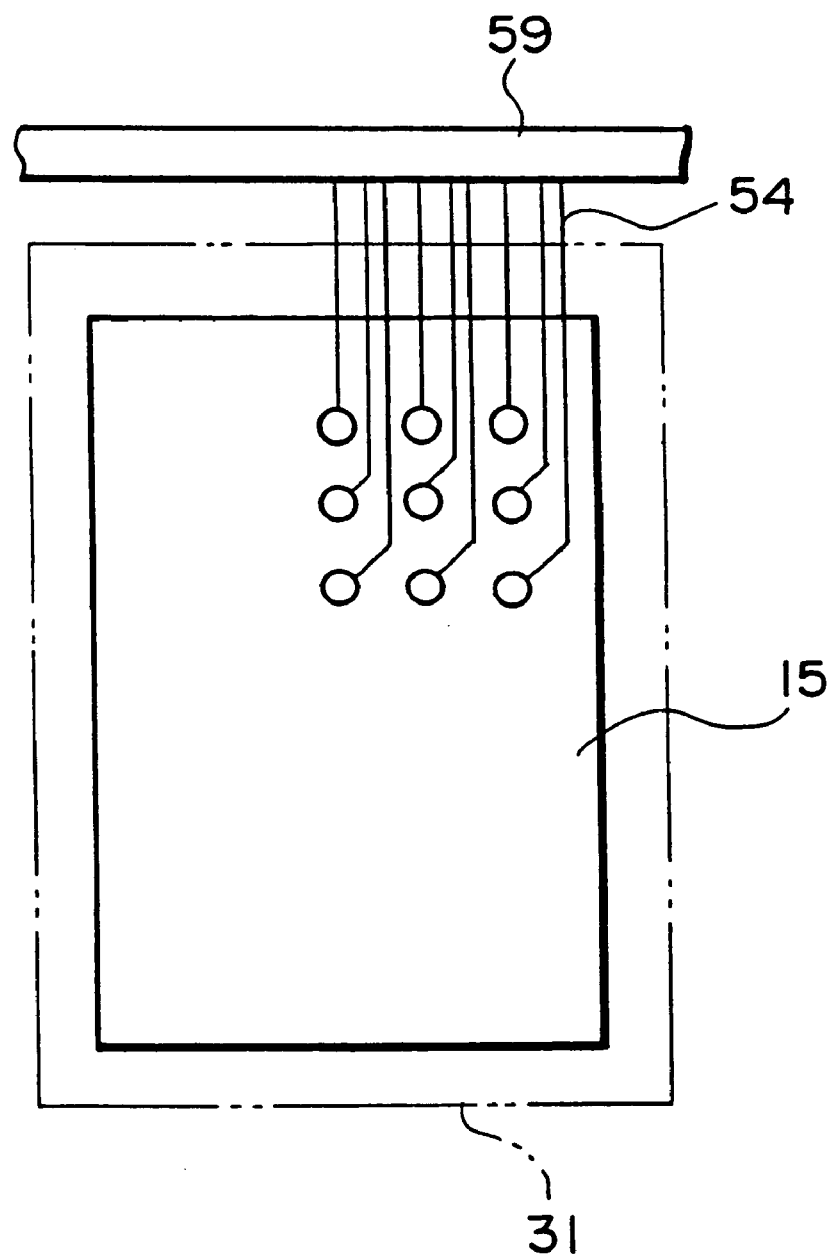
FIG. 21 shows a variant example of the method of manufacture of a film carrier tape (method of manufacture of a semiconductor device) of the present invention.

When the demands of package size are relatively mild, as shown in FIG. 21, the method of fabrication can be adopted in which after the connection of the IC chip 15 and the leads 54 is completed, die stamping can be carried out on the outside of the connection points with the chip (in FIG. 21, die stamping of the CSP end 31 shown by a dot-dot-dash line), and the leads 54 are cut away from the frame 59.

By means of this method of manufacture, since the leads 54 are connected individually to the frame 59, at an intermediate stage measurement pads (not shown in the drawing) may be provided, and after the leads have been separated from the frame in the last step of the process at points beyond the measurement pads, a well-known TAB test procedure may be used to carry out electrical tests, and without requiring investment in testing devices such as a special-purpose socket, good semiconductor devices (CSP) can be shipped.

As for the fabrication of a semiconductor assembly, the first embodiment can be applied almost without alteration.

Fourth Embodiment

Figure 22:
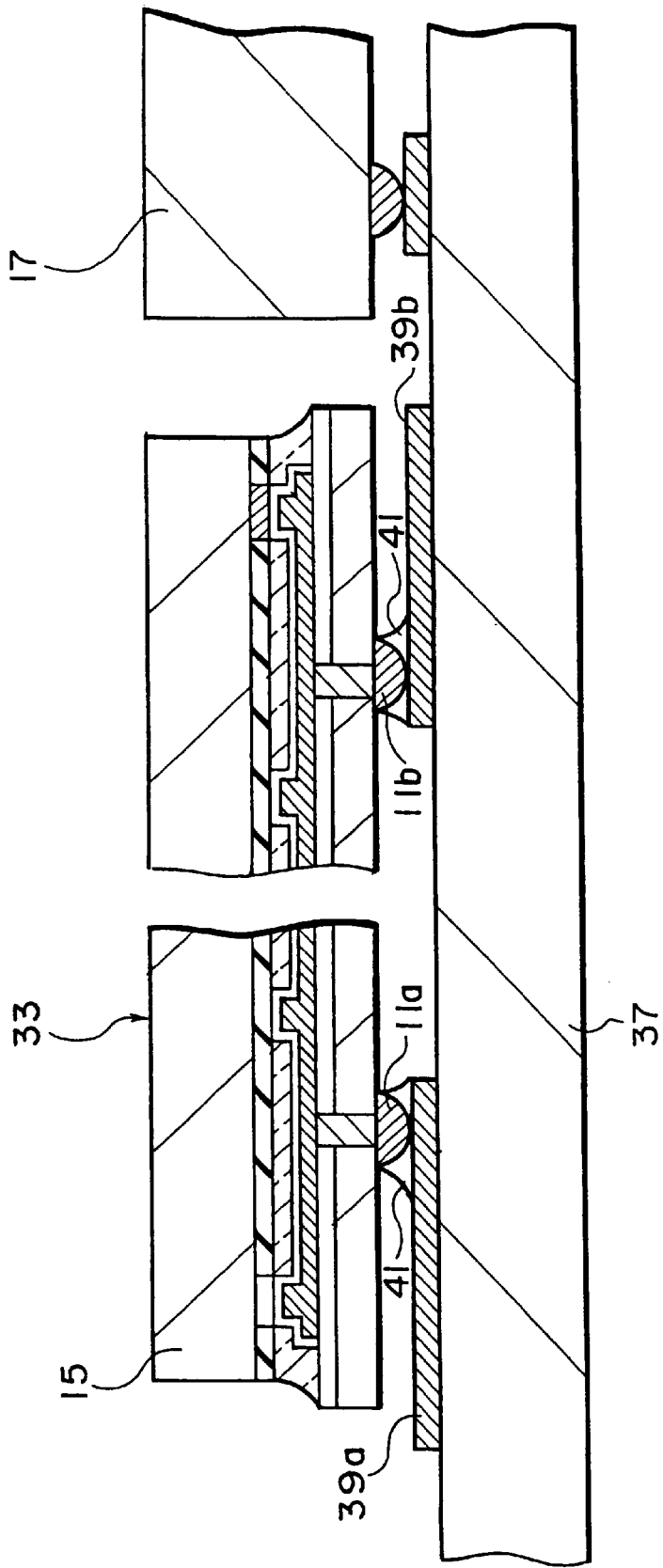
FIG. 22 is a cross-sectional view of the mounted board of the present invention.

FIG. 22 shows an embodiment of the present invention having the chip-size semiconductor device (CSP) 33 implemented on a printed wiring board 37. The benefit of the present invention is the ability to be mounted together with a well-known surface-mounted device (SMD), for example in SMT (surface-mounting technology: reflow process).

The external connection terminals (solder balls) 11a and 11b of the chip-size semiconductor device (CSP) 33 are connected to a conductor pattern 39a and 39b on the printed wiring board (mounted board) 37. Since the package size is chip size, an extremely high mounting density is possible. It should be noted that in FIG. 22, reference numeral 17 indicates another IC mounted on the printed wiring board 37.

In this case, since the external connection terminals (solder balls) 11a, 11b are fabricated using high-temperature solder, the height is preserved unchanged, and the soldering (connection) is carried out by means of solder cream 41 (eutectic solder) applied to the mounted board.

In this way, if high-temperature solder is used for the external connection terminals (solder balls) 11a and 11b, even with reflow mounting the external connection terminals do not melt at the melting point of the eutectic solder, and the height is maintained, as a result of which short-circuits caused collapse of the external connection terminals can be prevented. This technology can also be applied to other embodiments.

Fifth Embodiment

Figure 23:
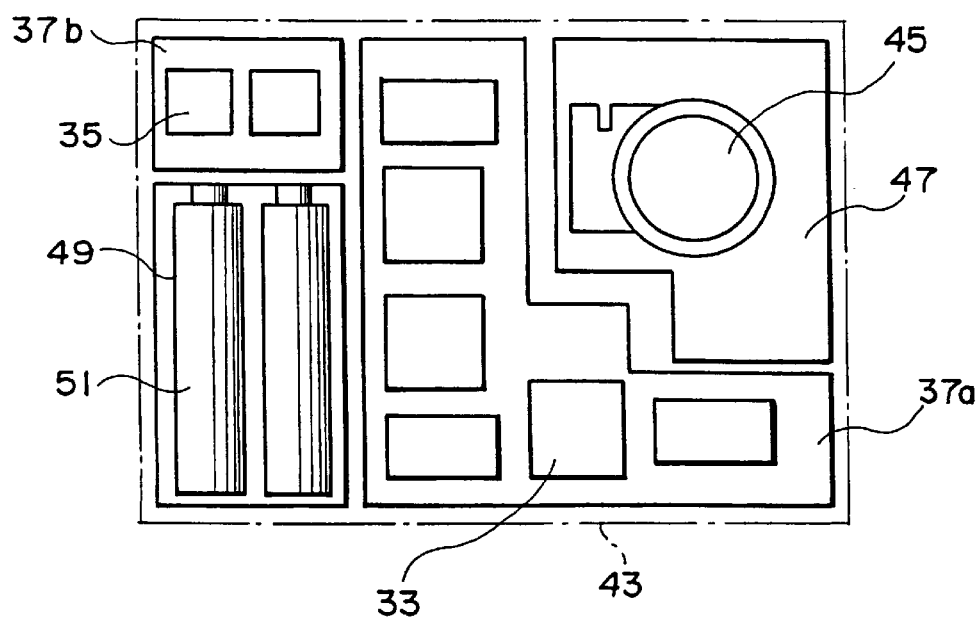
FIG. 23 is a plan view of the electronic instrument of the present invention.

FIG. 23 shows the interior of a camcorder incorporating a mounted board having mounted the chip-size semiconductor device (CSP) of the present invention.

A camcorder 43 incorporates two mounting substrates 37a and 37b, and on each of the mounting substrates are mounted CSPs 33 and 35 of the present invention.

In FIG. 23, reference numeral 45 indicates a lens, reference numeral 47 indicates a lens unit, reference numeral 49 indicates a battery box, and reference numeral 51 indicates a battery.

In this way, since the semiconductor device (CSP) of the present invention is chip size, it can be applied to camcorders and other portable electronic instruments in which compact and lightweight design is of the essence. Furthermore, the semiconductor device (CSP) of the present invention has high reliability in respect of its resistance to moisture and resistance to heat, and as a result has a role in increasing the reliability of a portable electronic instrument.

Sixth Embodiment

Figure 24:
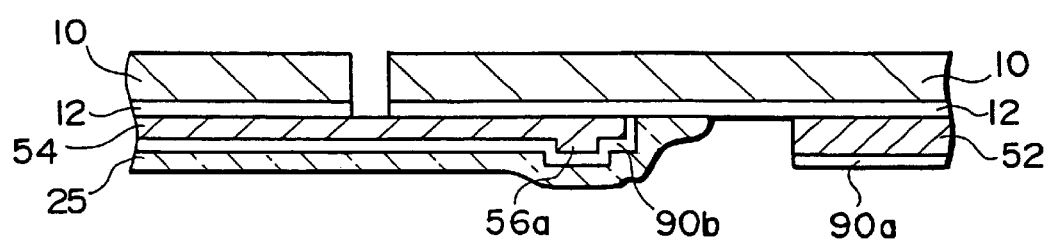
FIG. 24 is a cross-sectional view of a film carrier tape showing a thirtieth step in the method of manufacture of a semiconductor device of the present invention.
Figure 25A:
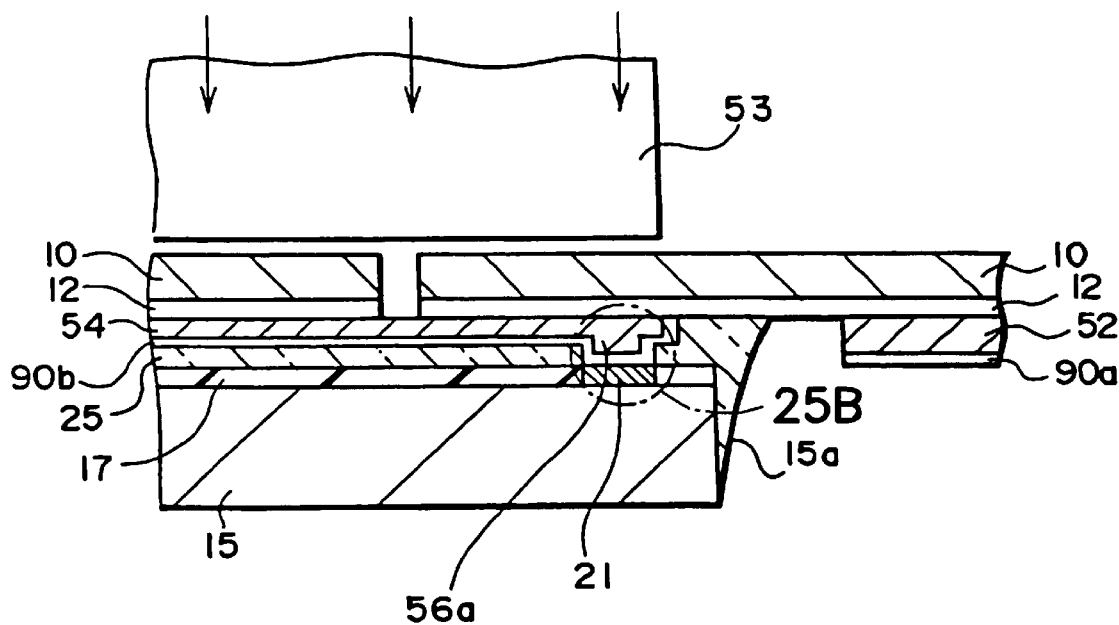
FIGS. 25A and 25B are cross-sectional views of a film carrier tape and semiconductor chip showing a thirty-first step in the method of manufacture of a semiconductor device of the present invention.
Figure 25B:
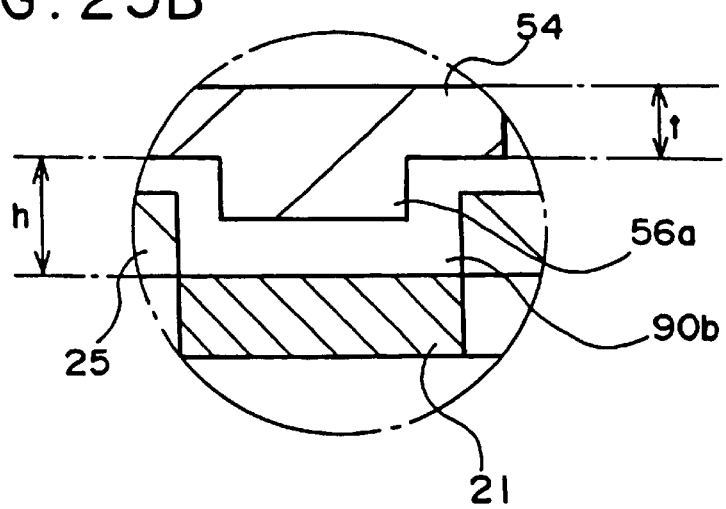
Figure 26:
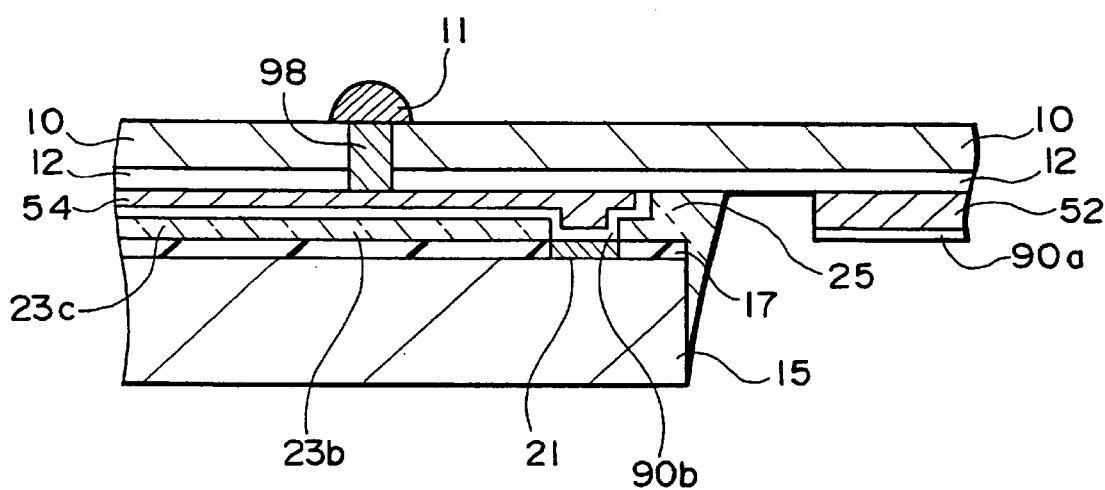
FIG. 26 is a cross-sectional view of a film carrier tape and semiconductor chip showing a thirty-second step in the method of manufacture of a semiconductor device of the present invention.

FIGS. 24 to 26 show a method of making another chip size semiconductor device (CSP) and semiconductor assembly of the present invention. At the same time, the construction is also shown.

Process A

Over the whole surface of the film carrier tape fabricated in step 9 shown in FIG. 11 is temporarily applied a conducting adhesive material 25, as shown in FIG. 24. As the conducting adhesive material 25 may be preferably used a film (sheet) of anisotropic conducting film fabricated by well-known technology. The anisotropic conducting film is fabricated by the dispersion of particles having electrical conductivity in an unhardened insulating adhesive (often referred to as the "B stage"). Therefore, by positioning the conducting adhesive material 25 on the film carrier tape and applying gentle heat, these can be temporarily adhered. The particles may be distributed over the whole film (at low cost because of the ease of fabrication), but may be concentrated in the portion close to the projections 56a. In this case, short-circuits caused by cohesion of particles in portions other than the portion close to the projections 56a are completely avoided, and as a result the reliability of the finished semiconductor assembly or semiconductor device (CSP) can be further improved.

An anisotropic conducting film is already commonly used in an LCD panel and TAB, and panel and bump IC mounting, so that existing equipment and technology can be applied to the process, and therefore the investment and technological risk can be kept to a minimum.

When an anisotropic conducting film is used as the conducting adhesive material 25, as shown in enlargement in FIG. 25B, the relation between the original thickness of the conducting adhesive material 25, the height t of the leads 54, and the height h of the bumps (projections 56a+plating layer 90b) is preferably such that:

original thickness of conducting adhesive material $25 \geq t+h$

In general:

$t \geq 5$ μm $h \geq 15$ μm

And therefore it is preferable that:

original thickness of conducting adhesive material $25 \geq 20$ μm

In this way, since the conducting adhesive material (anisotropic conducting film) 25 is thicker than t+h, it is harder for a gap to be formed between the polyimide film 10 or IC chip 15 to which the adhesive 12 is applied and the conducting adhesive material 25. By this means, the amount of bubbles is reduced, and the amount of included moisture reduced, so that corrosion is less likely to occur, and the moisture resistance and insulation reliability is improved. Since the conducting adhesive material 25 also passes around to the side surface 15a of the IC chip 15, the side surface protection of the IC chip 15 can be achieved, and in this respect also the reliability is improved.

It should be noted that in this embodiment, by the formation of projections 56a on the leads 54 and the plating layer 90b, bumps are formed, but bumps may equally be formed of gold solder or the like on the aluminum electrodes 21 of the IC chip 15. In this case again, if the thickness of the conducting adhesive material 25 is arranged to be more than the total of the height of the leads and bumps, the same benefits as described above will be obtained.

As the conducting adhesive material 25 may be used liquid or paste form anisotropic conducting adhesive or anisotropic conducting paste. While an anisotropic conducting film is easy to use, the materials for forming into a film are restricted, and it is therefore difficult to achieve a combination of high reliability and low cost. From this point of view, an anisotropic conducting adhesive or anisotropic conducting paste can be in liquid or paste form, and therefore high reliability and low cost can both be easily achieved. At the point of use, in place of temporary attachment, they can be applied to the whole surface of the film carrier tape by a dispenser.

Furthermore, the conducting adhesive material 25 is not restricted to a material having anisotropic conductivity, and a material having isotropic conductivity may also be used. However, when a material having isotropic conductivity is used, it must be used partially, to prevent adjacent aluminum electrodes 21 from being short-circuited.

Process B

Next, as shown in FIGS. 25A and 25B, the aluminum electrodes (bonding pads) 21 of the IC chip 15 are connected to the projections 56a at the extremities of the leads 54. These connections are carried out by the application of heat under pressure to the projections 56a at the extremities of the leads by the bonding tool 53, and by the expression of the adhesion of the conducting adhesive material 25 (application of bonding energy). In particular, when an anisotropic conducting film is used, in addition to the adhesive force, this is carried out by expression of the anisotropic conductivity. In other words, mechanical support of the polyimide film 10 and IC chip 15 by the hardening shrinkage of the adhesive, and expression of the conductivity only in the direction of the projections 56a and aluminum electrodes 21 by the particles (not shown in drawing) sandwiched between the projections 56a and aluminum electrodes (bonding pads) 21 are carried out simultaneously. The mechanism is the same in the case of an anisotropic conducting adhesive.

In this way, when seen in plan view, the same result is obtained as in FIG. 18. In FIG. 18, the heavy line indicates the IC chip 15. It should be noted that when a material having anisotropic conductivity is used as the conducting adhesive material 25, other than in the connection portions, the same insulation properties are shown as a resin (an insulating resin being formed), and therefore it is not necessary again to inject resin. Therefore, in this case the resin injection hole (reference numeral 42 in FIG. 18) need not be formed. By this means, the design freedom of the disposition of the external connection terminals (solder balls) is increased, and a smaller semiconductor device can be achieved. In particular, the necessity of providing resin stopping holes (44a, 44b in FIG. 18) because of the unfortunate tendency to leakage of the resin under the effect of the pressure adhesion of the anisotropic conducting film also disappears, and in both cases the die stamping of the polyimide tape is no longer required, and the semiconductor assembly and semiconductor device can be formed at a low cost.

The application of heat and pressure may be carried out from the reverse side of the IC chip, or may be carried out from both sides.

Once this stage has been reached, in the same way as described in step 12 in the first embodiment, the active surface of the IC chip, the aluminum electrodes, and other parts which are physically and chemically delicate are covered by an anisotropic conducting film or anisotropic conducting adhesive equivalent to an insulating resin, and therefore this form can be handled as a semiconductor assembly.

As a variant example, in the step shown in FIG. 24, the conducting adhesive material 25 having anisotropic conductivity may be applied by transfer or painting to the gap between the projections 56a and aluminum electrodes 21, thus providing conducting particles, and after the application of heat in the step shown in FIGS. 25A and 25B, the conductivity may be expressed only in the direction of the projections 56a and aluminum electrodes 21, and in other regions resin may be injected.

In this case, silver, silver palladium paste, or a similar conducting paste can be used, or alternatively, a film or liquid anisotropic conducting adhesive material may be used. When a conducting paste is used, since after applying heat and before injecting and hardening resin an electrical test can be carried out, a reworking step for bad samples is possible. In other words, since the adhesive strength of the conducting paste is relatively weak, it is mechanically possible to remove the connections to bad samples. In this way, before the added value accrues, bad samples can be rejected, and therefore it is possible to reduce the cost of rejects. It should be noted that the conducting adhesive material 25 may equally be provided only between the projections 56a and the aluminum electrodes 21, and may also project therefrom to a certain extent.

Process C

Next, as shown in FIG. 26, the via holes 30 are filled with a metal (nickel or the like) 98 by plating, printing, or similar method, and next, the external connection terminals (solder balls) 11 are formed. It should be noted that to obtain height precision the via holes 30 are filled with a metal such as nickel or the like, but from the point of view of reducing the number of fabrication steps the via holes 30 may be filled with solder, thus formation in a single process with the formation of the external connection terminals 11 being possible.

In this way, the IC chip 15 and the connection portion between the leads 54 and the IC chip 15 are covered by an anisotropic conducting film or the like before the external connection terminals are provided, and for this reason when the external connection terminals 11 are being formed there is no concern about contamination of the chip region, and therefore there is the advantage that the reliability is improved. It should be noted that as described in the first embodiment, in the step shown in FIG. 24 or the like, external connection terminals 11 may previously be provided. Further, through the steps from step 13 of the first embodiment, a semiconductor device (CSP) is finished.

In this embodiment, the conducting adhesive material 25 positioned between the IC chip 15 and the leads 54 forms a stress absorbing layer. In other words, after this embodiment of the semiconductor device is mounted on a mounting substrate (not shown in drawing), the conducting adhesive material 25 is able to absorb stresses occurring between the external connection terminals 11 and the mounting substrate. By mixing with the conducting adhesive material 25 a stress absorbing component (soft segment or rubber or the like), or by addition to the resin forming the conducting adhesive material 25, the above effect can be obtained. This effect can be obtained whether the conducting adhesive material 25 is an anisotropic conducting film or an anisotropic conducting adhesive.

It should be noted that in place of the conducting adhesive material 25, if an insulating adhesive not including conducting particles is used, the effect of preventing corrosion of the leads 54 and reducing the amount of bubbles is enhanced, and as a result the moisture resistance reliability and insulation reliability can be improved. By an insulating adhesive is meant an anisotropic conducting film or anisotropic conducting adhesive from which the conducting particles have been removed, in film or liquid form.

In this case, in order to maintain the state of connection between the aluminum electrodes 21 of the IC chip 15 and the projections 56a of the leads 54 formed on the polyimide film 10 (and the plating layer 90a), it is preferable a hardening resin is used. In more detail, it is preferable to use an epoxy resin or the like which does not soften at a high temperature. By this means, between the aluminum electrodes 21 and the projections 56a, even without a conducting junction material, an electrical connection between the two is possible.

Even in this case, since the leads 54 formed on the polyimide film 10 are positioned at the junction side surface with the IC chip 15, the leads 54 are not exposed to the outside. Therefore, there is the effect that the application of a solder resist can be omitted, the same is in the above described embodiment.

In the above described first to sixth embodiments, an example is described of using polyimide as the substrate material, but other well-known materials such as PET, glass epoxy, or the like may equally be used. Since a very high temperature is not required for the junction between the projections 56a and the aluminum electrodes 21, the range of materials which can be chosen is extremely wide, and the substrate material can be chosen according to particular objectives. Furthermore, the projections 56a are formed on the wiring pattern of the film carrier tape, but this may equally be provided as has been carried out for conventional TAB by forming bumps on the aluminum electrodes of the IC chip. Since the junction with the wiring pattern is on the tape, the effect that the problems of lead bending and the like brought about by conventional TAB are solved is unchanged. In this case, since a special tape with projections which has been described is not used, but rather an ordinary tape, a stable market supply can be obtained.

Seventh Embodiment

Figure 27:
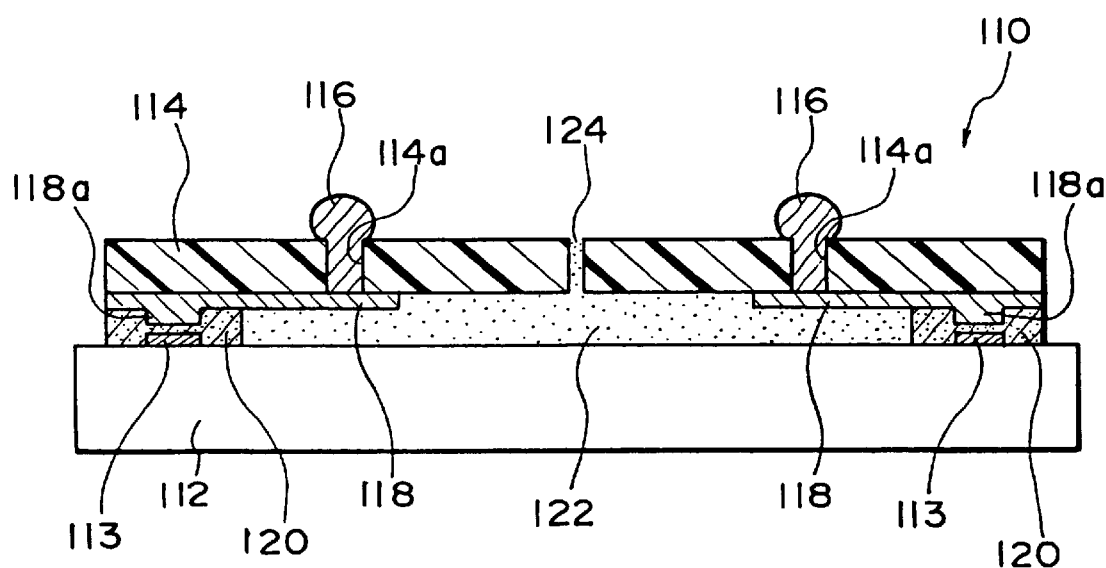
FIG. 27 shows a seventh embodiment of the semiconductor device.

FIG. 27 shows a seventh embodiment of the semiconductor device. This semiconductor device 110 includes a semiconductor chip 112 and an insulating film 14, and the insulating film 114 has formed external connection terminals 116. The semiconductor chip 112 has a plurality of electrodes 113. The electrodes 113 shown in FIG. 27 are formed only on two opposing sides, but as is well known may equally be formed on four sides.

In more detail, the insulating film 114 is formed from a polyimide resin or the like, and on one surface has a wiring pattern 118 formed. In the insulating film 114 are formed a plurality of holes 114a, and through these holes 114a external connection terminals 116 are formed on the wiring pattern 118. Therefore, the external connection terminals 116 are arranged to project from the surface opposite to that of the wiring pattern 118. It should be noted that the external connection terminals 116 are formed of solder, copper, nickel, or the like, in a ball shape.

On each of the traces of the wiring pattern 118 is formed a projection 118a. The projections 118a are formed to correspond to the electrodes 113 of the semiconductor chip 112. Therefore, when the electrodes 113 are arrayed on the four sides of the periphery of the semiconductor chip 112, the projections 118a are also formed in arrays on the four sides. The electrodes 113 are electrically connected to the projections 118a, and are arranged to conduct through the wiring pattern 118 to the external connection terminals 116. By the formation of the projections 118a, it is possible to provide a wide gap between the insulating film 114 and the semiconductor chip 112 and between the wiring pattern 118 and the semiconductor chip 112.

The electrical connection between the electrodes 113 and the projections 118a is achieved by means of an anisotropic conducting film 120. The anisotropic conducting film 120 is in the form of a sheet, with fine metallic particles (conducting particles) dispersed in a resin. When the anisotropic conducting film 120 is pressed between the electrodes 113 and the projections 118a, the metallic fine particles (conducting particles) are pressed, and thus electrical conduction is established between the two. When the anisotropic conducting film 120 is used, electrical conductivity is established only in the direction in which the metallic fine particles (conducting particles) are pressed, and there is not electrical conduction in other direction. Therefore, if a sheet of anisotropic conducting film 120 is attached on the plurality of electrodes 113, there is no electrical conduction between adjacent electrodes 113.

In this embodiment, the anisotropic conducting film 120 is formed only between the electrodes 113 and the projections 118a and in the vicinity thereof, but it may equally be formed only between the electrodes 113 and the projections 118a. In the gap formed between the insulating film 114 and the semiconductor chip 112 is formed a stress absorbing portion 122. The stress absorbing portion 122 is formed by injecting resin through a gel injection hole 124 formed in the insulating film 114.

As the resin forming the stress absorbing portion 122, is used a material with a low Young's modulus and good stress absorbing effect. For example, polyimide resin, silicone resin, silicone denatured polyimide resin, epoxy resin, silicone denatures epoxy resin, acrylic resin, or the like may be cited. By formation of the stress absorbing portion 122, externally applied stresses on the external connection terminals 116 can be absorbed.

Next, the principal steps in the method of manufacture of this embodiment of the semiconductor device 110 are described. First, in the insulating film 114, holes 114a for providing the external connection terminals 116 and a gel injection hole 124 are formed. Then a copper film is applied to the insulating film 114, and by etching the wiring pattern 118 is formed, and further, the region of formation of the projections 118a is masked, and etching is carried out to reduce other portions to a thin state. By removing the mask, the projections 118a can be formed.

On the insulating film, the anisotropic conducting film 120 is applied over the projections 118a. In more detail, when the plurality of projections 118a forms rows on two opposing sides, two parallel strips of anisotropic conducting film 120 are applied, and when the projections 118a are arrayed on four sides, the anisotropic conducting film 120 is applied in a corresponding rectangle.

In this way, the above described insulating film 114 is pressed on the semiconductor chip 112 with the projections 118a and the electrodes 113 corresponding, and the anisotropic conducting film 120 is pressed between the projections 118a and the electrodes 113. In this way, the electrical connection between the projections 118a and the electrodes 113 can be achieved.

Next, from the gel injection hole 124, a resin is injected, and the stress absorbing portion 122 is formed between the insulating film 114 and the semiconductor chip 112.

Then solder is provided on the wiring pattern 118 through the holes 114a, and ball-shaped external connection terminals 116 are formed.

By means of these steps, the semiconductor device 110 can be obtained. It should be noted that in this embodiment, the anisotropic conducting film 120 is used, but in place of this an anisotropic adhesive may be used. Except that it is not in sheet form, an anisotropic adhesive is of the same construction as the anisotropic conducting film 20.

Eighth Embodiment

Figure 28A:
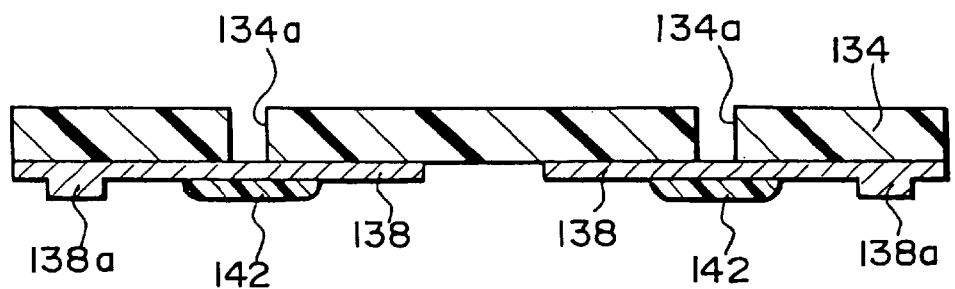
FIGS. 28A to 28C show a fabrication process of an eighth embodiment of the semiconductor device.
Figure 28B:
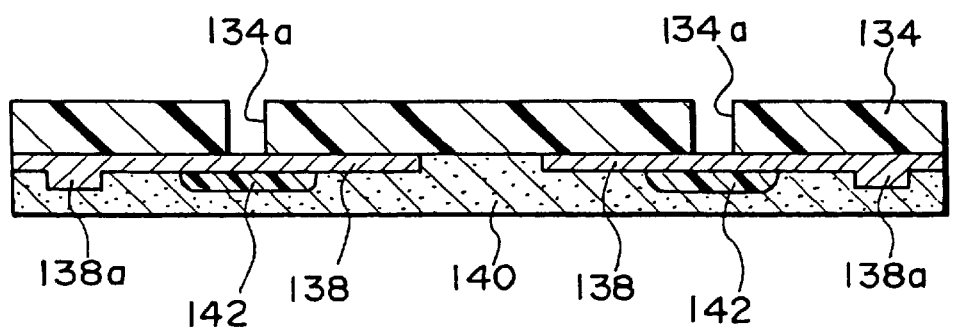
Figure 28C:
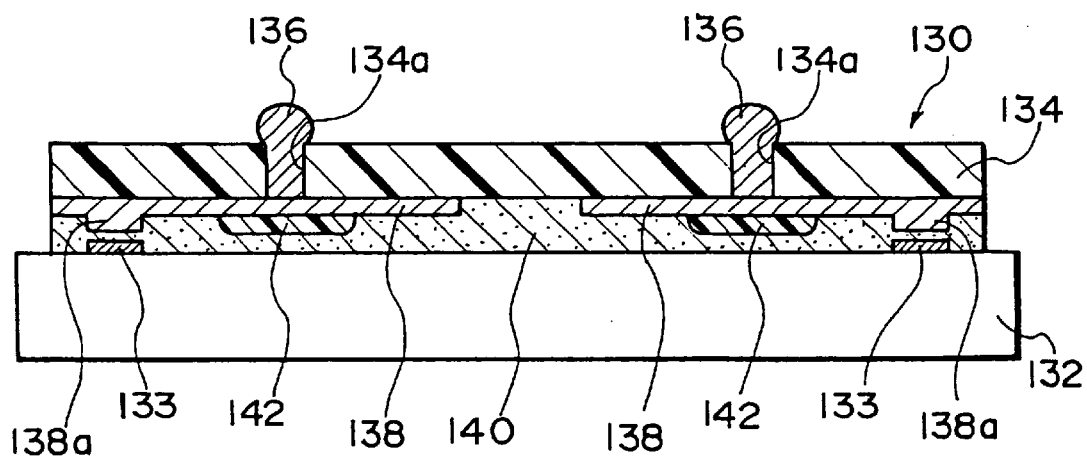

FIG. 28A to 28C show an eighth embodiment of the fabrication process of a semiconductor device. In these figures, the embodiment is described focusing on a single package, but normally the semiconductor devices will be fabricated continuously (in tape form (integrally)). The finished semiconductor device 130, as shown in FIG. 28C, includes a semiconductor chip 132 and an insulating film 134, and on the insulating film 134 are formed external connection terminals 136. This semiconductor device 130 is fabricated as follows.

First, in the insulating film 134, holes 134a are formed for forming the external connection terminals 136, a copper film is applied, and this is etched to form a wiring pattern 138. In the wiring pattern 138, by etching other portions relatively thinner, projections 138a are formed. The projections 138a are, as for the projections 118a in the seventh embodiment, formed in positions corresponding to electrodes 133 of the semiconductor chip 132.

As shown in FIG. 28A, a stress relieving portion 42 is formed on the wiring pattern 138. In more detail, the stress relieving portion 142 if provided only on the side of the wiring pattern 138 of the insulating film 134, in the region corresponding to the holes 134a and the vicinity thereof. The stress relieving portion 142 is formed of a resin such as Teflon, silicone, polyimide, or the like, and is applied by painting or printing, or by application in tape form. As the material of the stress relieving portion 142, the materials used in the seventh embodiment (polyimide resin, silicone resin, silicone denatured polyimide resin, epoxy resin, silicone denatured epoxy resin, and so forth) may be used.

Next, as shown in FIG. 28B, over the stress relieving portion 142 and wiring pattern 138, an anisotropic conducting film 140 is applied to the whole surface of the insulating film 134. The anisotropic conducting film 140 is similar to the anisotropic conducting film 120 in the above described first embodiment. Alternatively, in place of the anisotropic conducting film 140 an anisotropic adhesive may be used. It should be noted that the anisotropic conducting film 140 may equally be provided only in the vicinity of the projections 138a forming the junction portion, as is the anisotropic conducting film 120 shown in FIG. 27.

Next, as shown in FIG. 28C, the insulating film 134 to which the anisotropic conducting film 140 is applied, is applied to and pressed onto the semiconductor chip 132. In more detail, the insulating film 134 is pressed onto the semiconductor chip 132 so that the anisotropic conducting film 140 is pressed between the projections 138a and electrodes 133. In this way, there is electrical conduction between the projections 138a and electrodes 133 through the anisotropic conducting film 140. Furthermore, as shown in FIG. 28C, solder is provided through the holes 134a on the wiring pattern 138, and ball-shaped external connection terminals 136 are formed.

According to the semiconductor device 130 fabricated by the above process, stress applied to the external connection terminals 136 can be absorbed by the stress relieving portion 142. Moreover, since the stress relieving portion 142 is provided only in the region in which it is required to relieve stress, materials costs can be kept down.

Figure 29:
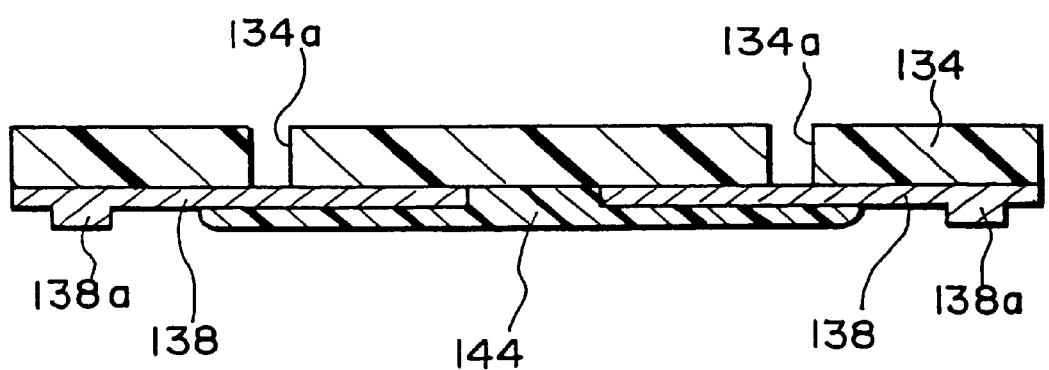
FIG. 29 shows a variant example of the fabrication process of the eighth embodiment of the semiconductor device.

This embodiment may be varied as shown in FIG. 29. FIG. 29 shows a variant example corresponding to FIG. 28A. Comparing FIGS. 29 and 28A, the insulating film 134 and wiring pattern 138 with the projections 150a are the same, but the stress relieving portion 144 shown in FIG. 29 is different from the stress relieving portion 142 shown in FIG. 28A.

The stress relieving portion 142 shown in FIG. 28A is formed individually in positions corresponding to the holes 134a and the vicinity thereof. On the other hand, the stress relieving portion 144 shown in FIG. 29 is formed as a single sheet over a region corresponding to a plurality of or all of the holes 134a. By means of this variant example again, the stress relieving can be achieved.

According to the variant example shown in FIG. 29, the position of the stress relieving portion 144 need not be precisely aligned to correspond with the holes 143a for forming the external connection terminals, and therefore positioning precision is not required. Moreover, since the stress relieving portion is provided in an overall manner rather than a localized manner, stress relieving can be even more so achieved.

In this variant example again, the anisotropic conducting film may equally be provided only in the vicinity of the projections 138a forming the junction portion, as is the anisotropic conducting film 120 shown in FIG. 27.

Ninth Embodiment

Figure 31A:
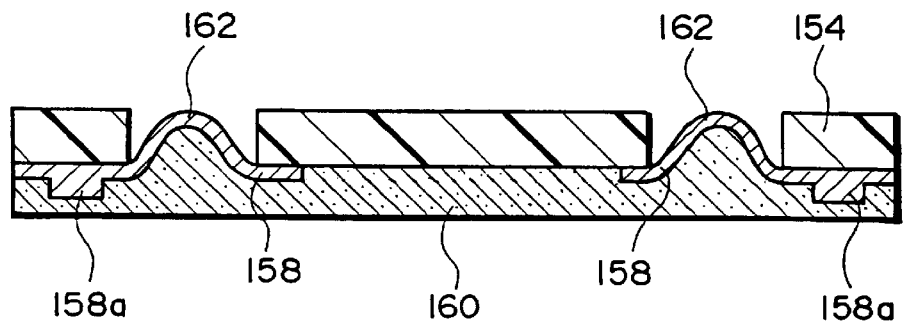
FIGS. 31A and 31B show a fabrication process of the ninth embodiment of the semiconductor device.
Figure 31B:
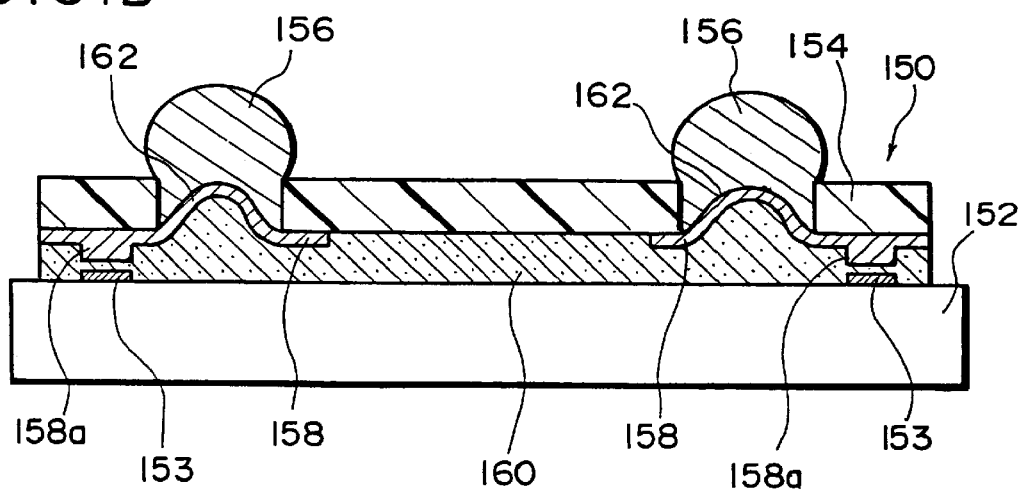

FIGS. 30 to 31B show a ninth embodiment of the fabrication process of a semiconductor device. The finished semiconductor device 150, as shown in FIG. 31B, includes a semiconductor chip 152 and insulating film 154, and on the insulating film 154 are formed external connection terminals 136. This semiconductor device 150 is fabricated as follows.

First, holes 154a are formed in a strip-shaped (before cutting into individual pieces) insulating film 154, a copper film is applied, and this is etched to form a wiring pattern 158 passing over the holes 154a. In the wiring pattern 158, by etching other portions relatively thinner, projections 158a are formed. The projections 158a are, as for the projections 118a in the seventh embodiment, formed in positions corresponding to electrodes 153 of a semiconductor chip 152.

Next, as shown in FIG. 30, the wiring pattern 158 is subjected to bending so that it enters the holes 154a, and three-dimensionally bent portions 162 are formed. The three-dimensionally bent portions 162 are bent in a rounded manner, so that there is no concentration of deformation stress, and cracks do not tend to form.

In the bending operation, a punch or the like may be used to form the three-dimensionally bent portions 162 one at a time, but in this embodiment, the die 151 shown in FIG. 30 is used. The die 151 has a plurality of projections 151a, and allows a plurality of three-dimensionally bent portions 162 to be formed simultaneously. Therefore, compared with the case in which a single three-dimensionally bent portion 162 is formed, the operation time is reduced, and the operation efficiency is improved, and it is also easy to form the three-dimensionally bent portions 162 all the same shape. The three-dimensionally bent portions 162, by being formed concavely into the holes 154a in a three-dimensional shape, are allowed to deform in the direction along the surface of the insulating film 154.

When the three-dimensionally bent portions 162 are formed, the ends 158b positioned on the periphery of the holes 154a in the wiring pattern 158 may possibly be dragged somewhat into the holes 154a. Therefore, in order that the ends 158b do not fall off inside the holes 154a, the height H of the three-dimensionally bent portions 162 and the original length d of the ends 158b should preferably be considered in the design. Specifically, it is preferable that:

$$H \geq d$$

In particular, when S, the total of the punching tolerance for the holes 154a and the pattern positioning tolerance is considered, it is even more preferable that:

$$H + S \geq d$$

In this way, when the three-dimensionally bent portions 162 are formed, falling off of the wiring pattern 158 can be prevented.

It should be noted that if the uppermost surface (outside) of the three-dimensionally bent portions 162 (the lower side in FIG. 30) is bent to a position equal to or less than the lower surface of the insulating film 154 in FIG. 30, then the three-dimensionally bent portions 162 do not project from the insulating film 154, and therefore transport of the insulating film 154 in the form of a tape is easy. The insulating film 154 generally has a thickness of approximately 75 μm, and if the three-dimensionally bent portions 162 are made to be of approximately this size, a stress absorbing effect can still be obtained. On the other hand, if the three-dimensionally bent portions 162 are formed to exceed the insulating film 154 upper surface, more effective stress absorption can be achieved.

Either before or after the process of forming the three-dimensionally bent portions 162, the wiring pattern 158 is plated.

Next, as shown in FIG. 31A, over the wiring pattern 158 an adhesive layer 160 is applied on the insulating film 154. The adhesive layer 160 serves to adhere the insulating film 154 to the semiconductor chip 152, and preferably has properties which absorb stress. Alternatively, if the adhesive layer 160 is liquid, it can be provided by printing.

In this embodiment, as the adhesive layer 160 an anisotropic conducting film is used, and thus electrical conduction can be achieved in the required positions. The anisotropic conducting film also has stress relieving properties. It should be noted that in place of the anisotropic conducting film an anisotropic adhesive may be used.

Next, as shown in FIG. 31B, the insulating film 154 on which the adhesive layer 160 is formed is applied to and pressed onto the semiconductor chip 152. In more detail, the insulating film 154 is pressed onto the semiconductor chip 152 so that the adhesive layer 160 being the anisotropic conducting film is pressed between the projections 158a and electrodes 153. In this way, there is conduction between the projections 158a and electrodes 153 through the adhesive layer 160 being the anisotropic conducting film.

Alternatively, as the adhesive layer 160 may be used an insulating material, and a conducting material may be provided between the projections 158a and the electrodes 153 to achieve the conduction between the two.

Furthermore, as shown in FIG. 31B, on the three-dimensionally bent portions 162 solder is provided, and ball-shaped external connection terminals 156 are formed. Testing can be carried out when required.

According to the semiconductor device 150 fabricated by the above process, even if the adhesive layer 160 does not absorb stress applied to the external connection terminals 156, the stress applied to the external connection terminals 156 can be absorbed by the three-dimensionally bent portions 162. It should be noted that if the three-dimensionally bent portions 162 are bent in an angular shape, although the durability may be inferior, as far as absorbing the stress is concerned, the same effect can be obtained.

Figure 32:
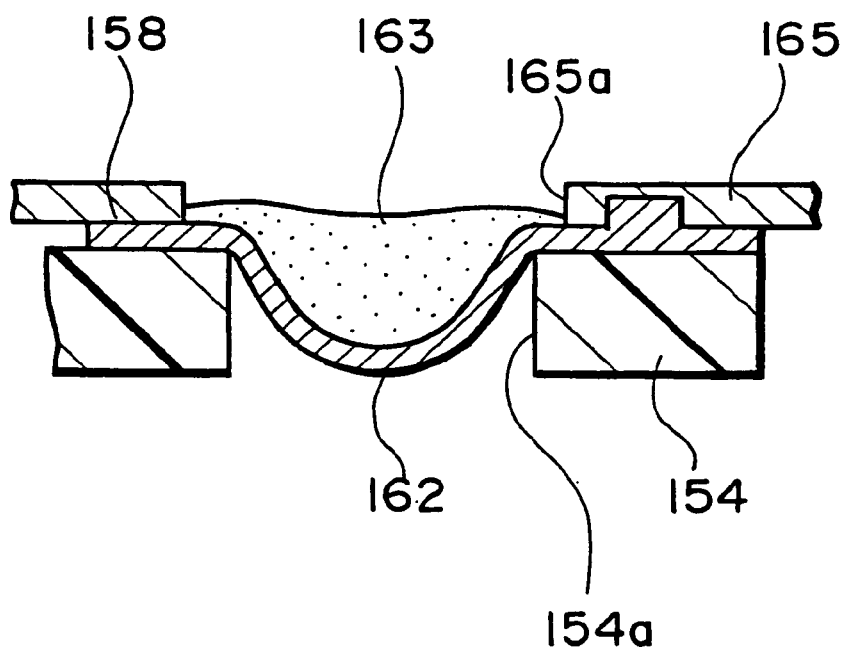
FIG. 32 shows a variant example of the ninth embodiment.

As a variant example of this embodiment, as shown in FIG. 32, on the concave side of the three-dimensionally bent portions 162, a resin 163 is provided beforehand which is softer than the anisotropic conducting film or anisotropic conducting adhesive, and if the adhesive layer 160 is provided the stress relieving function is improved. As the soft resin may be cited the resin used for the stress absorbing portion 122 in the seventh embodiment.

The resin 163 is provided by printing using a mask 165. An opening 165a in the mask 165 is formed to be larger than the three-dimensionally bent portions 162. In this way, the resin 163 can be contacted with the wiring pattern 158 before entering the concave side of the three-dimensionally bent portions 162. Therefore, stable printing is possible, and the yield of the printing process can be improved. Thereafter, an anisotropic conducting film is provided over the whole surface of or the projections of the semiconductor chip to carry out mounting in the above described mounting step.

In this embodiment, the electrodes 153 of the semiconductor chip 152 and the projections 158a of the wiring pattern 158 are connected by a conducting material, but the present invention may equally be applied if the two are connected by wire.

Figure 33:
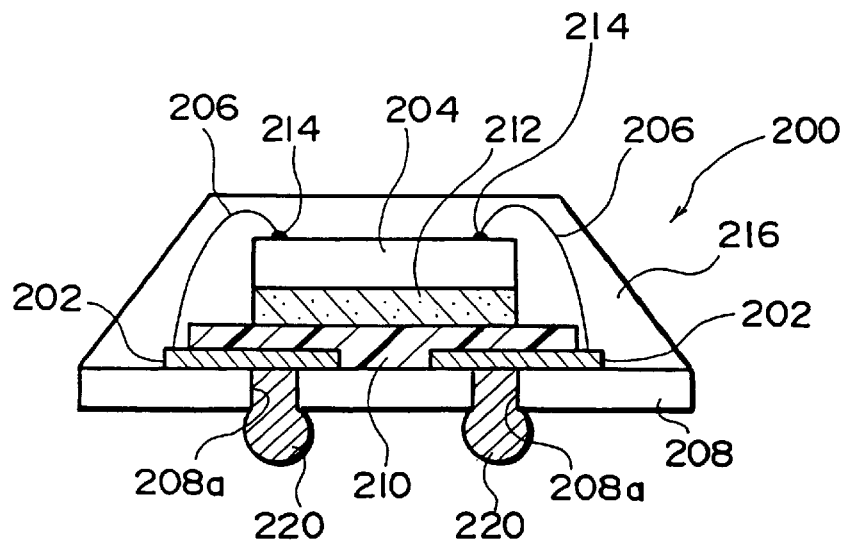
FIG. 33 shows a variant example of the ninth embodiment.

For example, the semiconductor device 200 shown in FIG. 33 has the wiring pattern 202 and semiconductor chip 204 connected by wires 206. In more detail, on the surface of the wiring pattern 202 formed on the insulating film 208, a stress absorbing layer 210 is formed, and this stress absorbing layer 210, through an adhesive 212, is adhered to the surface of the semiconductor chip 204 opposite to that having the electrodes 214. The insulating film 208 has holes 208a formed. Through these holes 208a, bumps 220 are formed on the wiring pattern 202. In more detail, bumps 220 are formed on the wiring pattern 202 so as to project from the surface of the insulating film 208 opposite to that of the wiring pattern 202. Then the periphery of the semiconductor chip 204 and the surface of the insulating film 208 having the wiring pattern 202 are sealed with a resin 216.

Figure 34:
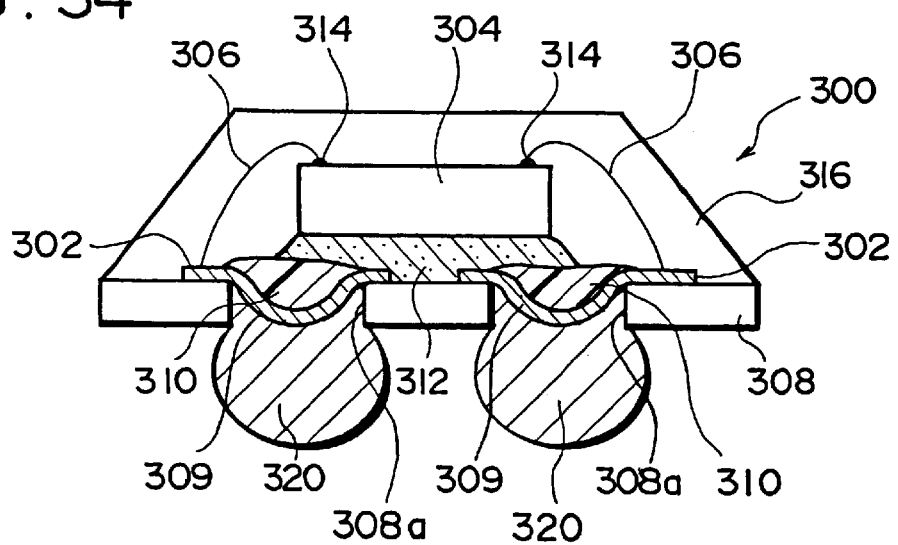
FIG. 34 shows a variant example of the ninth embodiment.

Alternatively, the semiconductor device 300 shown in FIG. 34 also has the wiring pattern 302 and semiconductor chip 304 connected by wires 306. In more detail, holes 308a are formed in the an insulating film 308, and in these holes 308a a part of the wiring pattern 302 is bent to enter therein, forming three-dimensionally bent portions 309. The side on which the three-dimensionally bent portions 309 are concave is filled with a resin 310 to achieve a stress relieving effect. On the opposite side, bumps 320 are formed on the three-dimensionally bent portions 309. In more detail, the three-dimensionally bent portions 309 have bumps 320 formed to project on the surface opposite to the surface of the insulating film 308 on which the wiring pattern 302 is forked. Then on the surface of the insulating film 308 having the wiring pattern 302 formed, with an adhesive 312 interposed, the surface of the semiconductor chip 304 opposite to the surface having the electrodes 314 is adhered. Then the periphery of the semiconductor chip 304 and the surface of the insulating film 308 having the wiring pattern 302 are sealed with a resin 316.

In these variant examples also, the wiring pattern 202 or 302 is formed on the surface of the insulating film 208 or 308 opposite to that from which the bumps 220 or 320 project, and therefore the wiring pattern 202 or 302 is not exposed to the exterior. Therefore, the application of solder resist can be omitted.

Even in these semiconductor devices in which wire is used for bonding, the construction can be such as to have a stress relieving function.

Tenth Embodiment

Figure 35:
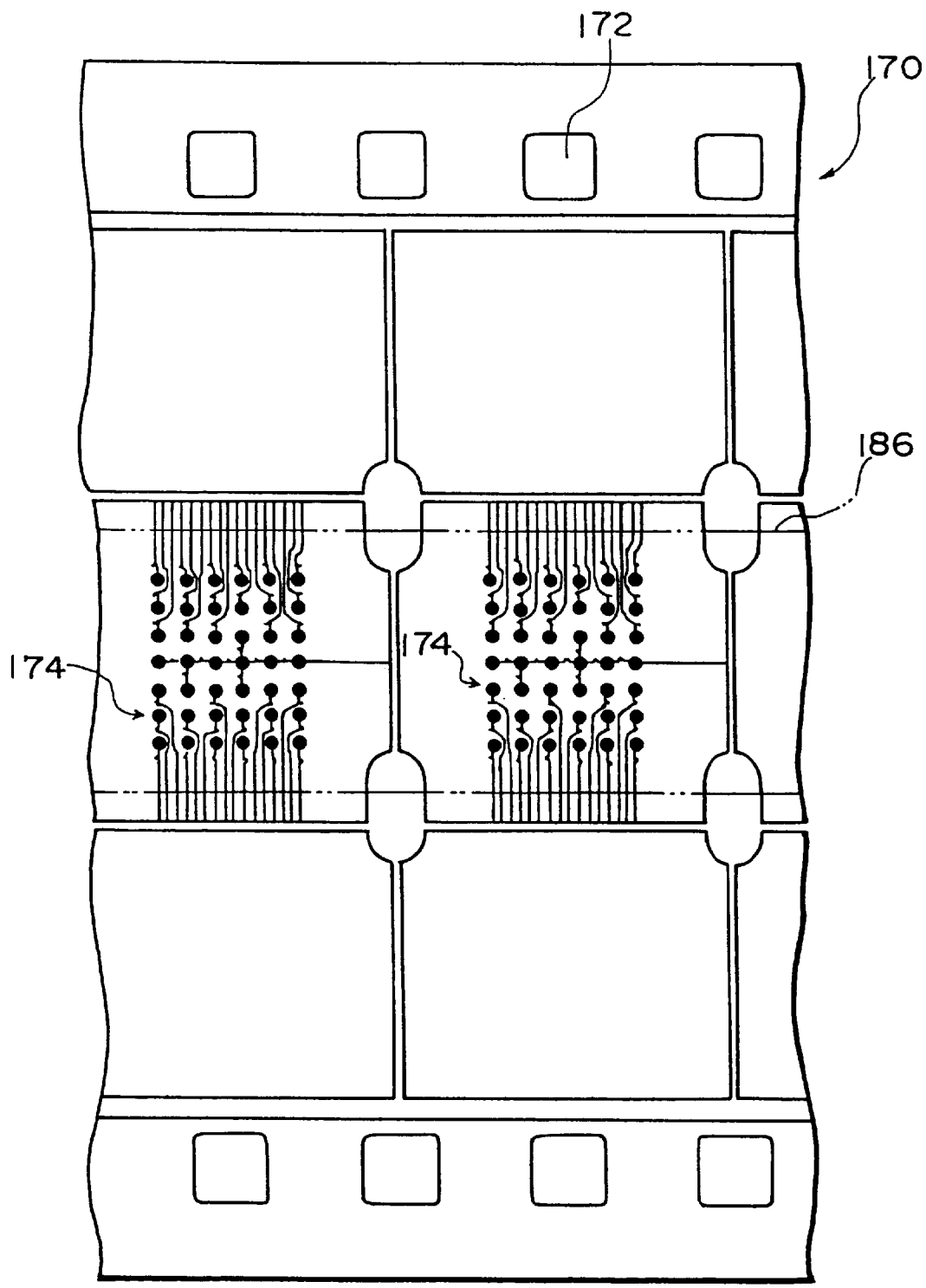
FIG. 35 shows a film carrier tape used in a tenth embodiment of the semiconductor device.
Figure 36:
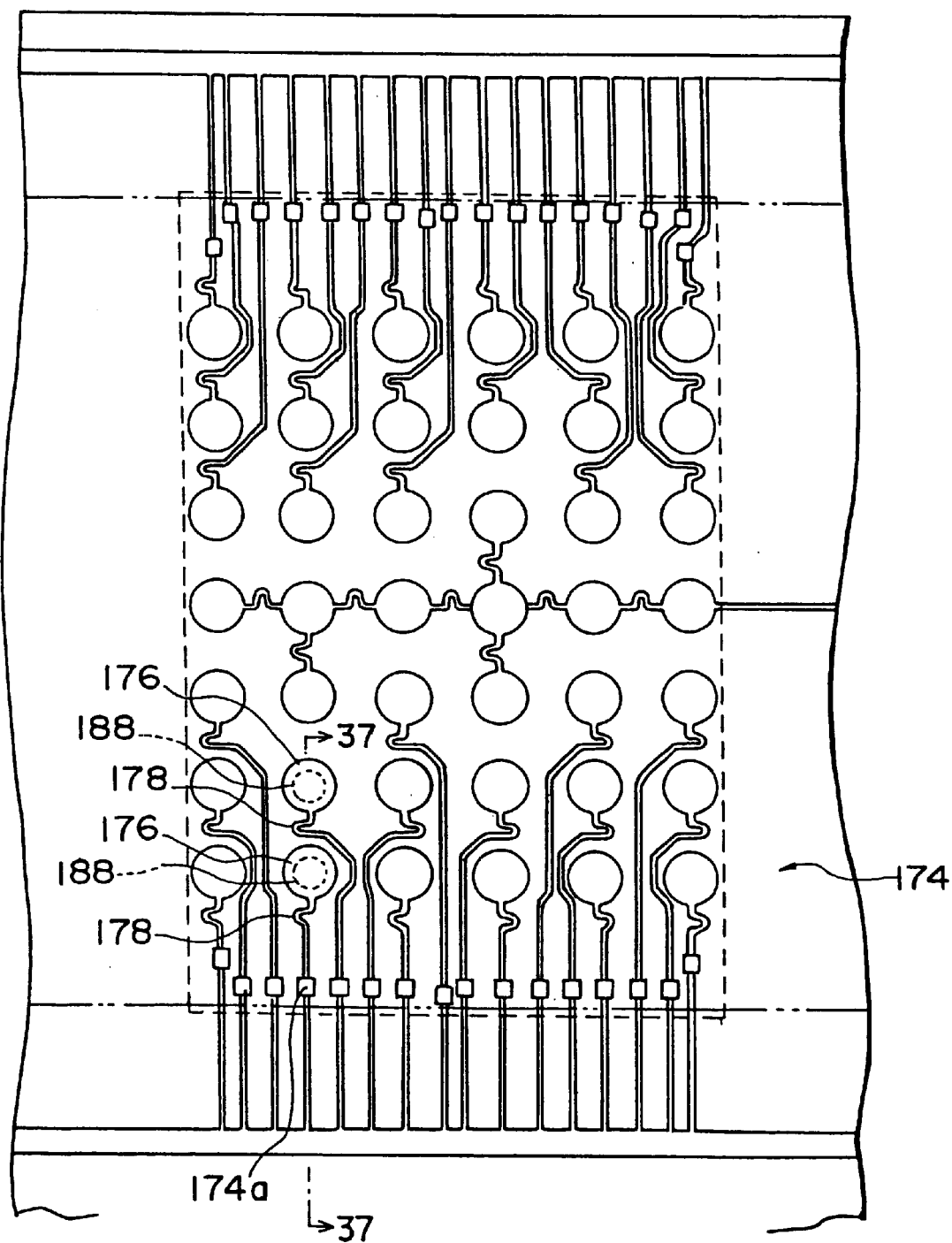
FIG. 36 is a partial enlargement of the film carrier tape shown in FIG. 35.

FIG. 35 shows a film carrier tape used in a tenth embodiment of the semiconductor device, and FIG. 36 is a partial enlargement of that figure. The film carrier tape 170 shown in FIG. 35 is used in the well-known TAB (Tape Automated Bonding) technology. For example, it has sprocket holes 172 and a plurality of wiring patterns 174 corresponding to individual semiconductor devices formed continuously. For the purposes of electroplating, all of the wiring patterns 174 are connected together, and similarly other matters the same as in the conventional case. It should be noted that FIGS. 35 and 36 are seen from the side on which the wiring patterns 174 are formed.

Figure 37:
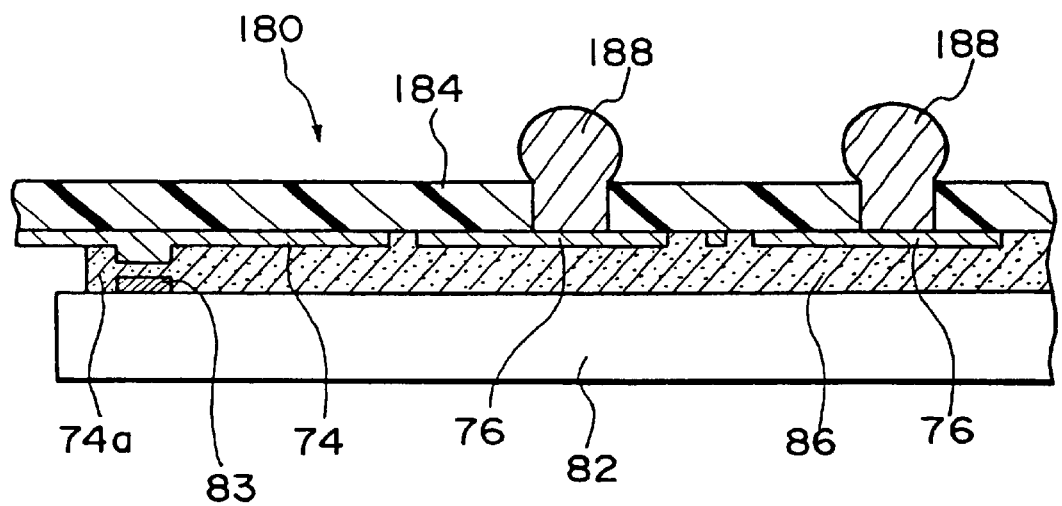
FIG. 37 shows a semiconductor device fabricated using the film carrier tape shown in FIGS. 35 and 36.
Figure 38:
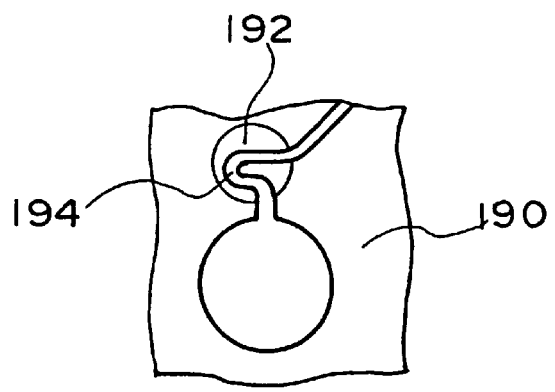
FIG. 38 shows a variant example of a plane bent portion shown in FIG. 36.

FIG. 37 corresponds to a section along the line 37—37 in FIG. 38, and shows a semiconductor device fabricated using this film carrier tape 170. The semiconductor device 180 shown in this figure comprises a semiconductor chip 182 and insulating film 184 punched out from the film carrier tape 170, and between the semiconductor chip 182 and the insulating film 184 is provided an anisotropic conducting film 186. With the anisotropic conducting film 188 interposed, projections 174a of the wiring pattern 174 and electrodes 183 of the semiconductor chip 182 are electrically connected, the same as in the above embodiment.

The anisotropic conducting film 186 is in tape form, and as shown by the dot-dot-dash line in FIG. 35, is applied over the wiring pattern 174 to the film carrier tape 170 along the longitudinal direction. The traces of the wiring pattern 174 are also aligned along the longitudinal direction of the film carrier tape 170, and therefore by simply applying the tape form anisotropic conducting film 186 in a straight line all of the wiring pattern 174 can be covered. It should be noted that in this embodiment, the wiring pattern 174 is arranged as a row of parallel traces, but may equally be arranged in a plurality of rows. In this case to cover the plurality of rows of the wiring pattern, it is preferable that an anisotropic conducting film wider than that of this embodiment is used.

A characteristic of this embodiment is the form of the wiring pattern 174. As shown in FIGS. 36 and 37, the wiring pattern 174 has projections 174a connected to electrodes 183, pads 176 for forming external connection terminals 188, and plane bent portions 178. The plane bent portions 178 are formed to connect the projections 174a and pads 176 while being bent in the plane. By the provision of the plane bent portions 178, even if stress is applied to the external connection terminals 188, this stress can be absorbed.

Furthermore, as shown in FIG. 38, if holes 192 are formed in the insulating film 190, and the plane bent portions 192 are formed to be floating within the holes 192, the plane bent portions 192 can deform freely, and therefore the stress can be even more so absorbed. It should be noted that within the holes 192, it is preferable to provide a soft resin. As the soft resin may be cited the resin used for the stress absorbing portion 122 in the seventh embodiment.

Figure 39:
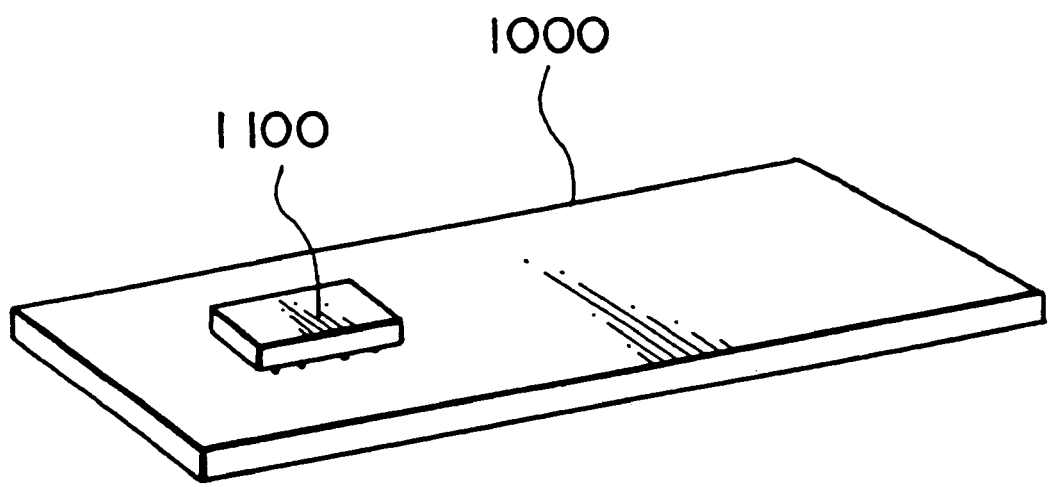
FIG. 39 shows a circuit board on which is mounted a semiconductor device applying the present invention.

In FIG. 39 is shown a circuit board 1000 on which is mounted a semiconductor device 1100 to which the present invention is applied. The circuit board 1000 generally uses an organic compound board such as glass epoxy. On the circuit board 1000 is formed a wiring pattern of for example copper to form a desired circuit, and by mechanical connection of the wiring pattern and the external connection terminals of the semiconductor device 1100, the electrical connection is achieved. In this case, the semiconductor device 1100 is constructed so as to absorb strain generated by differences in thermal expansion with the exterior, and when this semiconductor device 1100 is mounted on the circuit board 1000 and thereafter, the reliability can be improved. If appropriate attention is paid to the wiring of the semiconductor device 1100, the reliability during connection and the reliability after connection can be improved. It should be noted that the mounting area can also be reduced to the area for mounting as a bare chip. Therefore, when the circuit board 1000 is used in an electronic instrument, the electronic instrument itself can be made more compact. Within the same area, greater effective mounting space can be made available, and it is possible to design for greater functionality.

Figure 40:
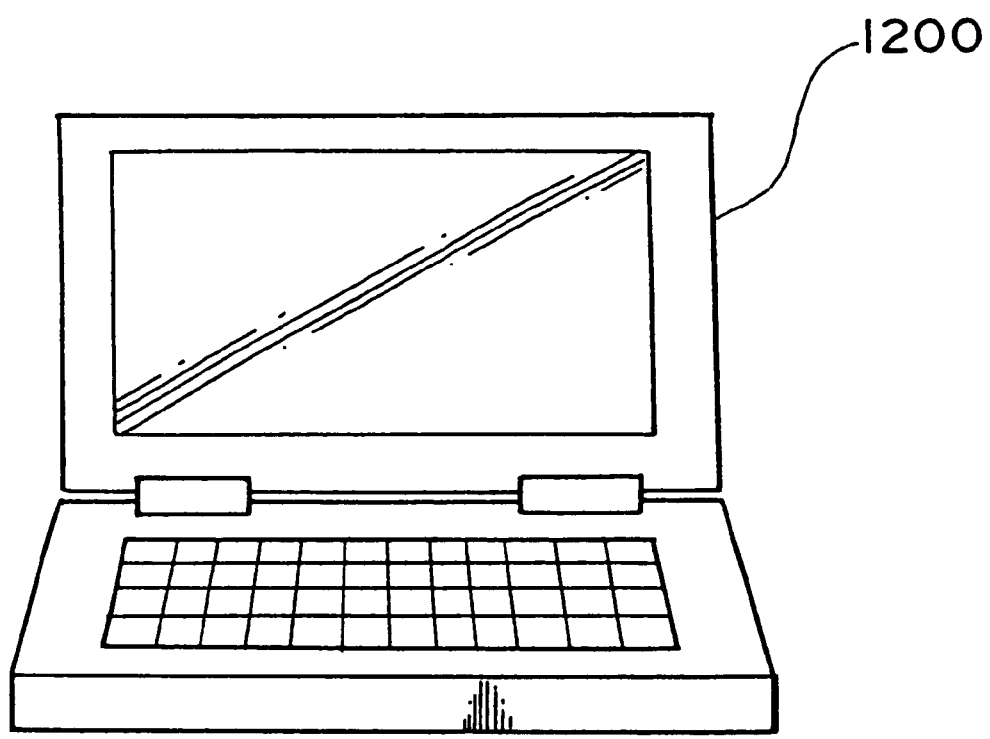
FIG. 40 shows an electronic instrument equipped with a circuit board on which is mounted a semiconductor device applying the present invention.

As an electronic instrument provided with this circuit board 1000, FIG. 40 shows a notebook personal computer 1200.

It should be noted that the above described embodiments apply the present invention to a semiconductor device, but the present invention can be applied to any surface-mounted electronic component requiring a number of external connection terminals in the same way as a semiconductor device, whether active or passive. As electronic components, for example, may be cited resistors, capacitors, coils, oscillators, filters, temperature sensors, thermistors, varistors, variable resistors, and fuses.

As the anisotropic conducting film described in the seventh to tenth embodiments may equally be used, as described in the first embodiment, an anisotropic conducting adhesive, an isotropic conducting adhesive or an insulating adhesive.

In the seventh to tenth embodiments, the example is given of projections formed on the side of the insulating film, but as described for the first embodiment, bumps may equally be formed on the electrodes of the semiconductor chip.

Furthermore, in the first to tenth embodiments, a wiring pattern is formed to be opposing on the semiconductor chip and insulating film, but the wiring pattern may equally be formed on the reverse side of the insulating film, and connected to the electrodes of the semiconductor chip by means of through holes, bump, or the like.

What is claimed is:

1. A film carrier tape, comprising:

a substrate material having flexible and insulating properties; and a wiring pattern formed on one of sides of the substrate material, the wiring pattern including a plurality of leads connected to a semiconductor element and a pad integrally formed with each of the leads for an external connection terminal formed thereon, each of the leads being adhered to the substrate material on a whole surface facing the substrate material, and the substrate material having an opening at a position corresponding to the pad for forming the external connection terminal, wherein the opening is smaller than the pad.

2. A semiconductor device comprising:

a substrate material having a wiring pattern formed on one of the surfaces of the substrate material, and external connection terminals formed on another surface of the substrate material, the substrate material also having a hole and at region for forming each of the external connection terminals, the wiring pattern having a three-dimensionally bent portion entering the whole, and each of the external connection terminals being formed on the three-dimensionally bent portion;

a semiconductor element facing the one of surfaces of the substrate material and having electrodes which are connected to the writing pattern;

an adhesion layer between the substrate material and the semiconductor element wherein the three-dimensionally bent portions are constructed to be deformed into the holes, providing a structure such that stress applied to the external connection terminals is absorbed.

* * * * *

UNITED STATES PATENT AND TRADEMARK OFFICE
CERTIFICATE OF CORRECTION

PATENT NO. : 6,414,382 B1
DATED : July 2, 2002
INVENTOR(S) : Nobuaki Hashimoto

It is certified that error appears in the above-identified patent and that said Letters Patent is hereby corrected as shown below:

<u>Title page,</u>
Item [54], Title, change "SEMICONDUCTOR DEVICE AND" to -- SEMICONDUCTOR DEVICE, AND --.

Item [63], Related U.S. Application Data, change "February 18, 1999" to -- January 16, 1998 --.

Signed and Sealed this

Twelfth Day of November, 2002

Attest:

Attesting Officer

JAMES E. ROGAN
*Director of the United States Patent and Trademark Office*